(12) United States Patent  
Kando

(10) Patent No.: US 7,323,803 B2  
(45) Date of Patent: Jan. 29, 2008

(54) BOUNDARY ACOUSTIC WAVE DEVICE

(75) Inventor: Hajime Kando, Ritto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 11/470,017

(22) Filed: Sep. 5, 2006

(65) Prior Publication Data

US 2007/0001549 A1    Jan. 4, 2007

Related U.S. Application Data

(63) Continuation of application No. PCT/JP2005/003518, filed on Mar. 2, 2005.

(30) Foreign Application Priority Data

Mar. 5, 2004   (JP)   .............................. 2004-062921

(51) Int. Cl.
*H01L 41/08* (2006.01)
(52) U.S. Cl. .............................. 310/313 A; 310/313 R
(58) Field of Classification Search ............ 310/313 A, 310/313 R, 313 B
See application file for complete search history.

(56) References Cited

U.S. PATENT DOCUMENTS

| 6,037,847 | A | 3/2000 | Ueda et al. |
| 6,317,015 | B1 | 11/2001 | Ueda et al. |
| 7,208,860 | B2 * | 4/2007 | Kadota et al. .......... 310/313 A |

2003/0132684 A1   7/2003 Nakagawara et al.

FOREIGN PATENT DOCUMENTS

| JP | 06-350377 A | 12/1994 |
| JP | 09-107264 A | 4/1997 |
| JP | 2001-251157 A | 9/2001 |
| JP | 2002-152003 A | 5/2002 |
| JP | 2003-188679 A | 7/2003 |
| JP | 2003-258594 A | 9/2003 |
| WO | 98/51011 A1 | 11/1998 |
| WO | 98/52279 A1 | 11/1998 |

OTHER PUBLICATIONS

J.J. Campbell et al.; "A Method For Estimating Optimal Crystal Cuts and Propagation Directions For Excitation of Piezoelectric Surface Waves"; IEEE Trans. Sonics and Ultrason.; vol. SU-15; No. 4; pp. 209-217; Oct. 1968.

"Elastic Wave Device Technology Handbook"; Japan Society for the Promotion of Science, Elastic Wave Device Technology, The 150th Committee; 1st Edition 1st printing; published on Nov. 30, 2001; p. 549.

(Continued)

*Primary Examiner*—Mark Budd  
(74) *Attorney, Agent, or Firm*—Keating & Bennett, LLP

(57) ABSTRACT

A boundary acoustic wave device includes a dielectric body disposed over one surface of a $LiTaO_3$ piezoelectric body, and an electrode including an IDT and reflectors at the boundary between the piezoelectric body and the dielectric body. The thickness of the electrode is set so that the acoustic velocity of the SH boundary acoustic waves is less than the acoustic velocities of slow transverse waves propagating in the dielectric body and slow transverse waves propagating in the piezoelectric body.

19 Claims, 26 Drawing Sheets

OTHER PUBLICATIONS

"LiTaO3"; Journal of the Acoustical Society of Japan; vol. 36, No. 3, 1980, pp. 140-145.

International Search Report issued in the corresponding International Application No. PCT/JP2005/003518, mailed on May 10, 2005.

Yamanouchi et al., "Piezoelectric Acoustic Boundary Waves Propagating Along the Interface Between SiO2 and LiTaO3," IEEE Transactions On Sonics And Ultrasonics, Nov. 1978, pp. 384-389, vol. SU-25, No. 6.

Takashi et al., "Highly Piezoelectric Boundary Waves Propagating In Si/Si02/LiNb03 Structure," 26th EM Symposium, May 1997, pp. 53-58.

Yamashita et al., "Highly Piezoelectric SH-type Boundary Waves,"IEICE Technical Report, vol. 96, No. 249, Sep. 1996, pp. 21-26.

Ozawa et al., "Fabrication of Boundary Wave Device by Wafer Bonding Techniques," Piezoelectric Materials and Device Symposium, Feb. 27, 2003, pp. 59-60.

* cited by examiner

○ U2-Vf
× U2-Vm
——————— FAST TRANSVERSE WAVES IN LT
- - - - - - - - - - - SLOW TRANSVERSE WAVES IN SiO₂
—·—·—·—·— SLOW TRANSVERSE WAVES IN LT

BOUNDARY ACOUSTIC WAVE DEVICE

BACKGROUND OF THE INVENTION

1. Field of the Invention

The present invention relates to boundary acoustic wave devices using SH boundary acoustic waves, and particularly to a boundary acoustic wave device including an electrode disposed at the boundary between a $LiTaO_3$ piezoelectric body and a dielectric body.

2. Description of the Related Art

A variety of surface acoustic wave devices have been used for cellular phone RF or IF filters, VCO resonators, television VIF filters, and other devices. Surface acoustic wave devices use surface acoustic waves propagating along a surface of a medium, such as Rayleigh waves or first leaky waves.

Since the surface acoustic waves propagate along a surface of a medium, they are sensitive to changes in the surface conditions. In order to protect the surface of the medium along which surface acoustic waves propagate, the surface acoustic wave element is hermetically enclosed in a package having a hollow portion in a region opposing the surface acoustic wave-propagating surface of the medium. The package having such a hollow portion inevitably increases the cost of the surface acoustic wave device. Also, since the package is much larger than the surface acoustic wave element, the size of the resulting surface acoustic wave device is increased.

In addition to the surface acoustic waves, acoustic waves include boundary acoustic waves propagating along the boundary between solids.

For example, "Piezoelectric Acoustic Boundary Waves Propagating Along the Interface Between $SiO_2$ and $LiTaO_3$" IEEE Trans. Sonics and Ultrason., VOL. SU-25, No. 6, 1978 IEEE (Non-Patent Document 1) discloses a boundary acoustic wave device including an IDT provided on a 126°-rotated Y-plate X-propagating $LiTaO_3$ substrate, and a $SiO_2$ layer having a predetermined thickness disposed over the IDT and the $LiTaO_3$ substrate. This device propagates SV+P boundary acoustic waves called Stoneley waves. Non-Patent Document 1 discloses that when the $SiO_2$ layer has a thickness of $1.0\lambda$ ($\lambda$: wavelength of boundary acoustic waves), the electromechanical coupling coefficient is 2%.

Boundary acoustic waves propagate with their energy concentrated on the boundary between the solids. The bottom surface of the $LiTaO_3$ substrate and the top surface of the $SiO_2$ film, therefore, have very little energy, and the characteristics are not varied depending on the changes in the surface conditions of the substrate or the thin layer. Thus, the package having the hollow portion can be eliminated, and the size of the acoustic wave device can be reduced accordingly.

"Highly Piezoelectric Boundary Waves Propagating In $Si/SiO_2/LiNbO_3$ Structure" (26th EM Symposium, May 1997, pp. 53-58) (Non-Patent Document 2) discloses SH boundary waves propagating in a [001]-Si(110)/$SiO_2$/Y-cut X-propagating $LiNbO_3$ structure. This type of SH boundary waves features an electromechanical coupling coefficient $K^2$ greater than that of the Stoneley waves. With the use of the SH boundary waves, similar to the use of Stoneley waves, the package having the hollow portion can be eliminated. In addition, since SH boundary waves have SH-type fluctuation, the strips defining an IDT reflector have a greater reflection coefficient as compared to those used for Stoneley waves. Therefore, the use of SH boundary waves for, for example, a resonator or a resonator filter facilitates reducing the size of the device and produces sharp characteristics.

Other related boundary acoustic wave devices are disclosed in "Highly Piezoelectric SH-type Boundary Waves" IEICE Technical Report Vol. 96, No. 249 (US96 45-53) pp. 21-26, 1996 (Non-Patent Document 3), and "Fabrication of Boundary Wave Device By Wafer Bonding Techniques" (in Japanese), Ozawa, Yamada, Omori, Hashimoto, and Yamaguchi, Piezoelectric Materials and Device Symposium, 2003, Piezoelectric Materials and Device Symposium Executive Committee, Feb. 27, 2003, pp. 59-60 (Non-Patent Document 4).

A boundary acoustic wave device must have an appropriate electromechanical coupling coefficient in accordance with the application and must have a low propagation loss, power flow angle, and temperature coefficient of frequency. In addition, low spurious responses are required in the vicinity of the main response.

Specifically, the loss of boundary acoustic waves accompanied with their propagation, that is, propagation loss adversely affects the insertion loss of the boundary acoustic wave filter, the resonant resistance, and the impedance ratio of the boundary acoustic wave resonator. The impedance ratio is the ratio of the impedance at the resonant frequency to the impedance at the anti-resonant frequency. Thus, it is desirable to reduce the propagation loss.

The power flow angle represents the difference in direction between the phase velocity of boundary waves and the group velocity of boundary wave energy. If the power flow angle is large, the IDT must be disposed at an angle according to the power flow angle. Accordingly, the electrode is complicated to design, and a loss resulting from the displacement of the angles is likely to occur.

The changes in operation frequency with temperature of a boundary wave device reduce the practicable pass band or stop band if the boundary wave device is a boundary wave filter. If the boundary wave device is a resonator, the changes in operation frequency with temperature cause abnormal oscillation in an oscillation circuit. Thus, it is desirable to reduce the TCF, which is a change in frequency per degree centigrade.

A low loss resonator filter may be constructed by, for example, disposing reflectors in the propagation direction outside the region provided with a transmitting and a receiving IDT for transmitting and receiving boundary waves. The bandwidth of the resonator filter depends on the electromechanical coupling coefficient when using the boundary waves. A higher electromechanical coupling coefficient $k^2$ leads to a broadband filter, and a lower electromechanical coupling coefficient leads to a narrowband filter. Accordingly, boundary wave devices must use an appropriate electromechanical coupling coefficient $k^2$ in accordance with their applications. For RF filters of cellular phones, the electromechanical coupling coefficient $k^2$ should be at least about 3%, and preferably at least about 5%.

However, in the boundary acoustic wave device disclosed in the above-described Non-Patent Document 1 using Stoneley waves, the electromechanical coupling coefficient is as low as about 2%.

SUMMARY OF THE INVENTION

To overcome the problems described above, preferred embodiments of the present invention provide a boundary acoustic wave device using SH boundary waves, which provides sufficiently large electromechanical coupling coefficient at the main response, a low propagation loss and power flow angle, a frequency temperature coefficient within the allowable range, and low spurious response of Stoneley waves in the vicinity of the main response.

A first preferred embodiment of the present invention provides a boundary acoustic wave device including a LiTaO$_3$ piezoelectric body, a dielectric body disposed over one surface of the piezoelectric body, and an electrode disposed at the boundary between the piezoelectric body and the dielectric body. The electrode satisfies the expression $H>1.1\times10^6\rho^{-1.7}$ where the electrode has a density of $\rho$ (kg/m$^3$) and a thickness of H($\lambda$) and the boundary acoustic waves have a wavelength of $\lambda$.

A second preferred embodiment provides a boundary acoustic wave device including a LiTaO$_3$ piezoelectric body, a SiO$_2$ dielectric body disposed on one surface of the piezoelectric body, and an electrode disposed at the boundary between the piezoelectric body and the dielectric body. The electrode satisfies the expression $H>25000\rho^{-1.46}$ where the electrode has a density of $\rho$ (kg/m$^3$) and a thickness of H($\lambda$) and the boundary acoustic waves have a wavelength of $\lambda$.

Preferably, the expression $\rho>2659$ kg/m$^3$ is satisfied in the second preferred embodiment of the present invention.

Alternatively, the expression $\rho>4980$ kg/m$^3$ is satisfied in the first and second preferred embodiments of the present invention.

The electrode preferably includes an electrode layer made of at least one metal selected from the group consisting of Al, Ti, Fe, Cu, Ag, Ta, Au, and Pt.

According to another preferred embodiment, the electrode further includes a second electrode layer. The second electrode layer is made of a different material from that of the first electrode layer and is provided on the upper or lower surface of the first electrode layer.

In the first preferred embodiment, the dielectric layer is preferably made of a non-piezoelectric material.

The dielectric layer preferably has a multilayer structure including a plurality of dielectric layers.

In the first preferred embodiment, the dielectric layer is preferably made of at least one selected from the group consisting of Si, SiO$_2$, glass, SiN, SiC, ZnO, Ta$_2$O$_5$, lead zirconate titanate ceramics, AlN, Al$_2$O$_3$, LiTaO$_3$, LiNbO$_3$, and potassium niobate (KN).

The dielectric layer is preferably formed using a deposition method.

The boundary acoustic wave device according to preferred embodiments of the present invention preferably further includes a resin layer disposed on the surface of the dielectric layer opposite the boundary.

The boundary acoustic wave device according to the first preferred embodiment includes the dielectric body on one surface of the LiTaO$_3$ piezoelectric body, and the electrode at the boundary between the piezoelectric body and the dielectric body with the expression $H>1.1\times10^6\rho^{-1.7}$ being satisfied. This structure enables the acoustic velocity of SH boundary acoustic waves to be reduced to less than the acoustic velocity of slow transverse waves propagating in the LiTaO$_3$ of the piezoelectric body, and consequently provides a boundary acoustic wave device using SH boundary waves with a low propagation loss.

The boundary acoustic wave device according to the second preferred embodiment has an electrode at the boundary between the LiTaO$_3$ piezoelectric body and the SiO$_2$ dielectric body with the expression $H>25000\rho^{-1.46}$ being satisfied. This structure enables the acoustic velocity of SH boundary waves propagating along the boundary between the LiTaO$_3$ and the SiO$_2$ to be reduced to less than the acoustic velocity of transverse waves propagating in the SiO$_2$, and consequently provides a boundary acoustic wave device using SH boundary acoustic waves that exhibits a low propagation loss in spite of the waves being the leaking type.

In the second preferred embodiment, if the $\rho$ is higher than about 2659 kg/m$^3$, the electrode thickness H can be reduced to about 0.25$\lambda$ or less, which is the electrode thickness at which the velocity of the SH boundary waves is reduced to less than that of the slow transverse waves propagating in the SiO$_2$. Thus, the electrode can be easily formed by thin layer deposition method.

In preferred embodiments of the present invention, the electrode made of at least one metal selected from the group consisting of Al, Ti, Fe, Cu, Ag, Ta, Au, and Pt ensures the production of a boundary wave device using SH boundary waves according to the present invention. If the electrode further includes a second electrode layer made of a different metal from the above-described electrode layer, the adhesion between the electrode and the dielectric body or LiTaO$_3$ or the electric power resistance can be enhanced by appropriately selecting the metal forming the second electrode.

The dielectric body may be piezoelectric, and preferably includes SiO$_2$ as the principal constituent. A SiO$_2$ dielectric body improves the temperature coefficient of the frequency.

In preferred embodiments of the present invention, the dielectric body may have a multilayer structure including a plurality of dielectric layers. The dielectric layers may include a variety of dielectric materials.

In the first preferred embodiment, by forming the dielectric layer of at least one selected from the group consisting of Si, SiO$_2$, glass, SiN, SiC, Al$_2$O$_3$, ZnO, Ta$_2$O$_5$, lead zirconate titanate ceramics, AlN, LiTaO$_3$, LiNbO$_3$, and potassium niobate (KN), a boundary wave device using SH boundary waves is obtained according to the present invention.

In addition, by using at least one non-piezoelectric material selected from the group consisting of Si, SiO$_2$, glass, SiN, SiC, and Al$_2$O$_3$ as the material of the dielectric layer, the dielectric layer can be stably and reliably formed by deposition method, because the dielectric layer is not adversely affected by the nonuniformity of the piezoelectric characteristics of the dielectric layer.

In the formation of the dielectric layer according to preferred embodiments of the present invention, for example, if the substrate bonding method disclosed in Non-Patent Document 4 is used for bonding the LiTaO$_3$ and the dielectric body together, the boundary waves may be nonuniformly propagated due to the nonuniformity of the bonded region. Accordingly, critical defects may occur, such as significantly large deviation in frequency, variation in insertion loss of filters, variation in resonant resistance of resonators. In addition, to obtain sufficient strength to prevent the substrate from breaking during the manufacturing process, the dielectric layer and the LiTaO$_3$ that are to be bonded together have to have thicknesses of, for example, at least about 300 μm. Accordingly, the resulting device is as thick as about 600 μm. According to preferred embodiments of the present invention, a deposition method, such as sputtering method, vapor deposition method, or CVD method (chemical vapor deposition method), is preferably used instead of the bonding method. The deposition method facilitates the formation of a uniform, thin layer over the entire surface of a substrate, and produces a more uniform frequency, insertion loss, and resonant resistance than the bonding method. The deposition method enables the thickness of the dielectric layer to be about 2$\lambda$ with the LiTaO$_3$ having a thickness of, for example, about 300 μm to maintain the strength. For example, the dielectric layer may have a thickness as small as about 10 μm for boundary waves with a wavelength λ of about 5 μm. Thus, the thickness of the resulting device is reduced to about 310 μm, for example.

In preferred embodiments of the present invention, if a resin layer is formed on the surface of the dielectric layer opposite the boundary, the moisture resistance is enhanced by appropriately selecting the material for the resin layer.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
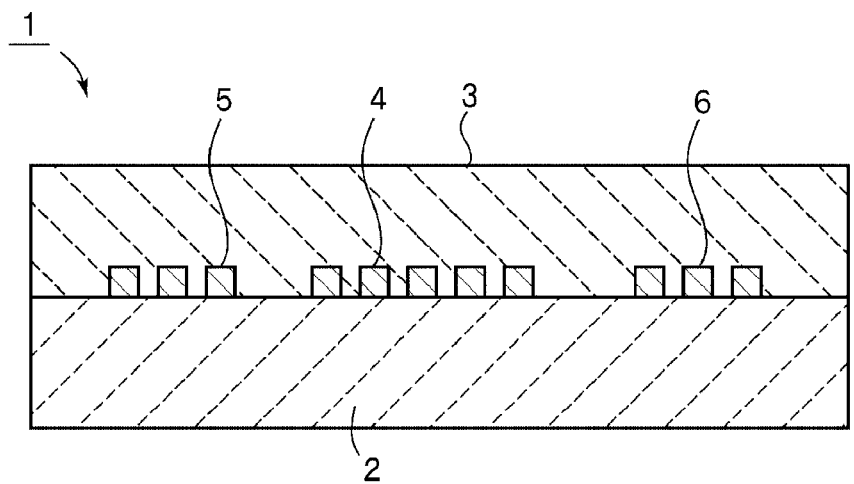
FIG. 1 is a front sectional view of a boundary acoustic wave device according to a preferred embodiment of the present invention.
Figure 2:
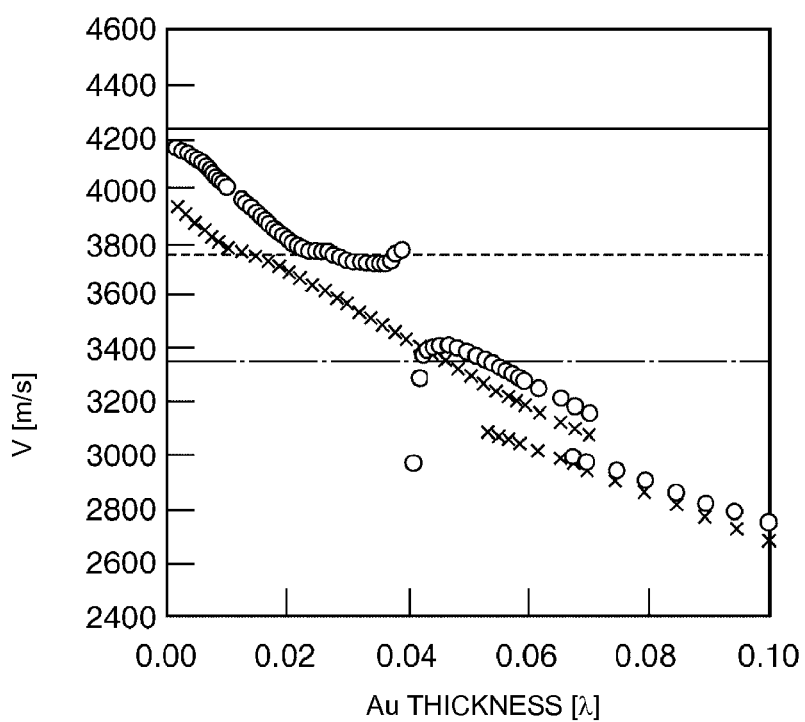
FIG. 2 is a plot showing the relationship between the thickness of a Au electrode and the acoustic velocity V of some types of waves in a structure including the Au electrode and a $SiO_2$ layer on a (0°, 90°, 0°) $LiTaO_3$ substrate.
Figure 3:
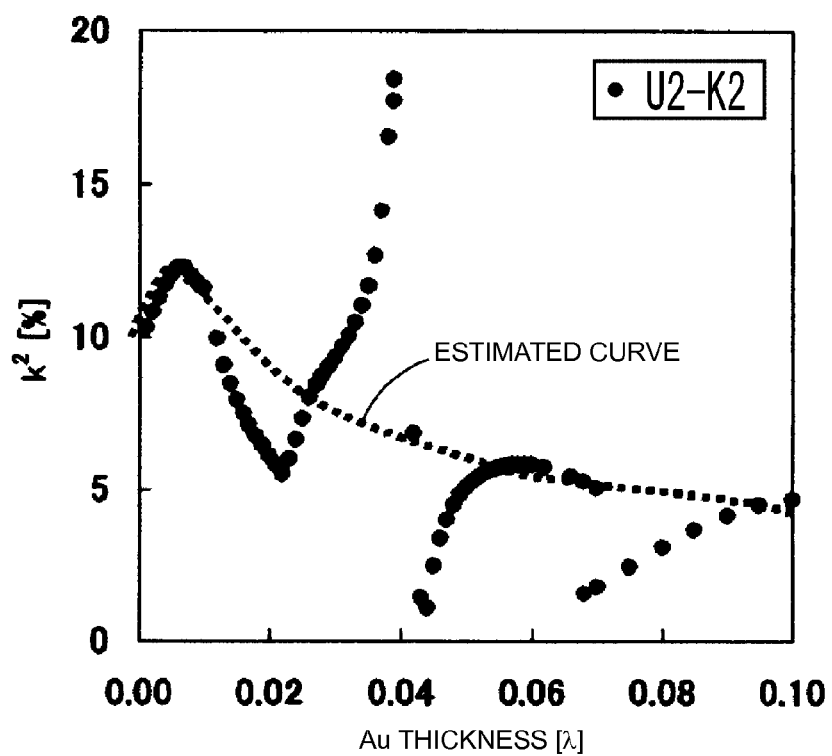
FIG. 3 is a plot showing the relationship between the thickness of the Au electrode and the electromechanical coupling coefficient $k^2$ of SH boundary waves (U2) in the structure including the Au electrode and the $SiO_2$ layer on the (0°, 90°, 0°) $LiTaO_3$ substrate.
Figure 4:
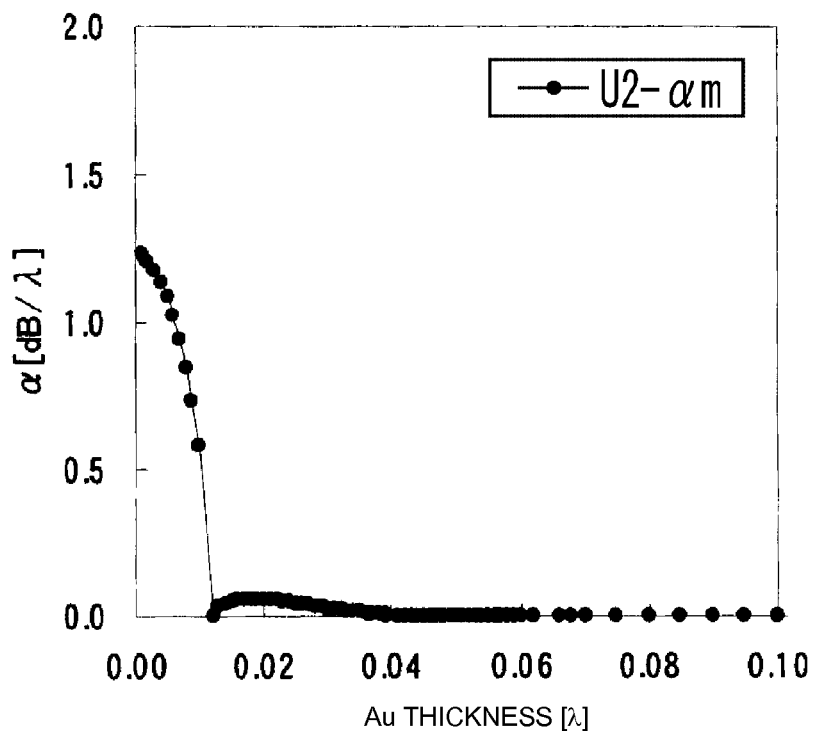
FIG. 4 is a plot showing the relationship between the thickness of the Au electrode and the propagation loss α of SH boundary waves (U2) in the structure including the Au electrode and the $SiO_2$ layer on the (0°, 90°, 0°) $LiTaO_3$ substrate.
Figure 5:
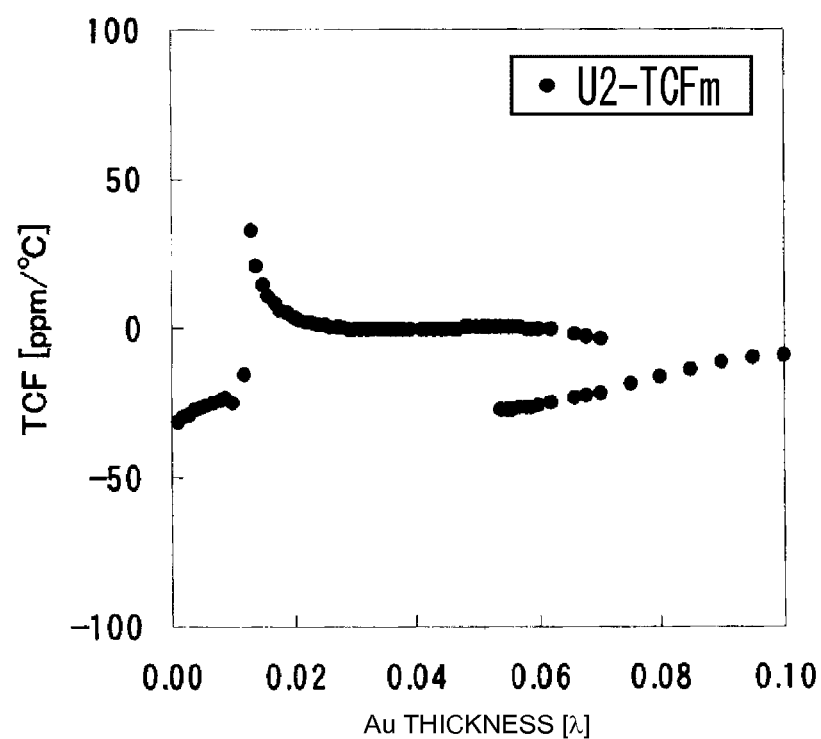
FIG. 5 is a plot showing the relationship between the thickness of the Au electrode and the frequency temperature coefficient TCF of SH boundary waves (U2) in the structure including the Au electrode and the $SiO_2$ layer on the (0°, 90°, 0°) $LiTaO_3$ substrate.
Figure 6:
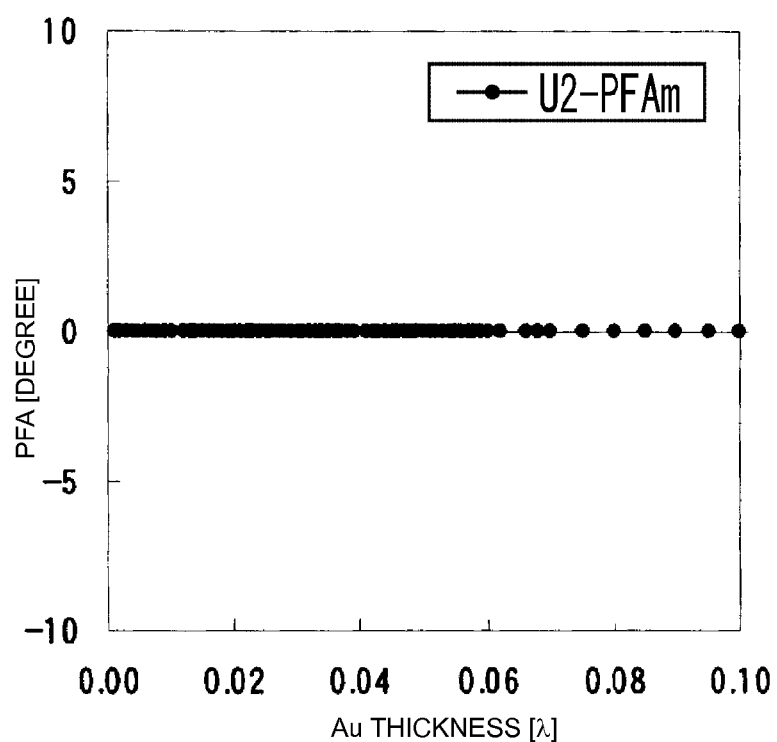
FIG. 6 is a plot showing the relationship between the thickness of the Au electrode and the power flow angle PFA of SH boundary waves (U2) in the structure including the Au electrode and the $SiO_2$ layer on the (0°, 90°, 0°) $LiTaO_3$ substrate.
Figure 7:
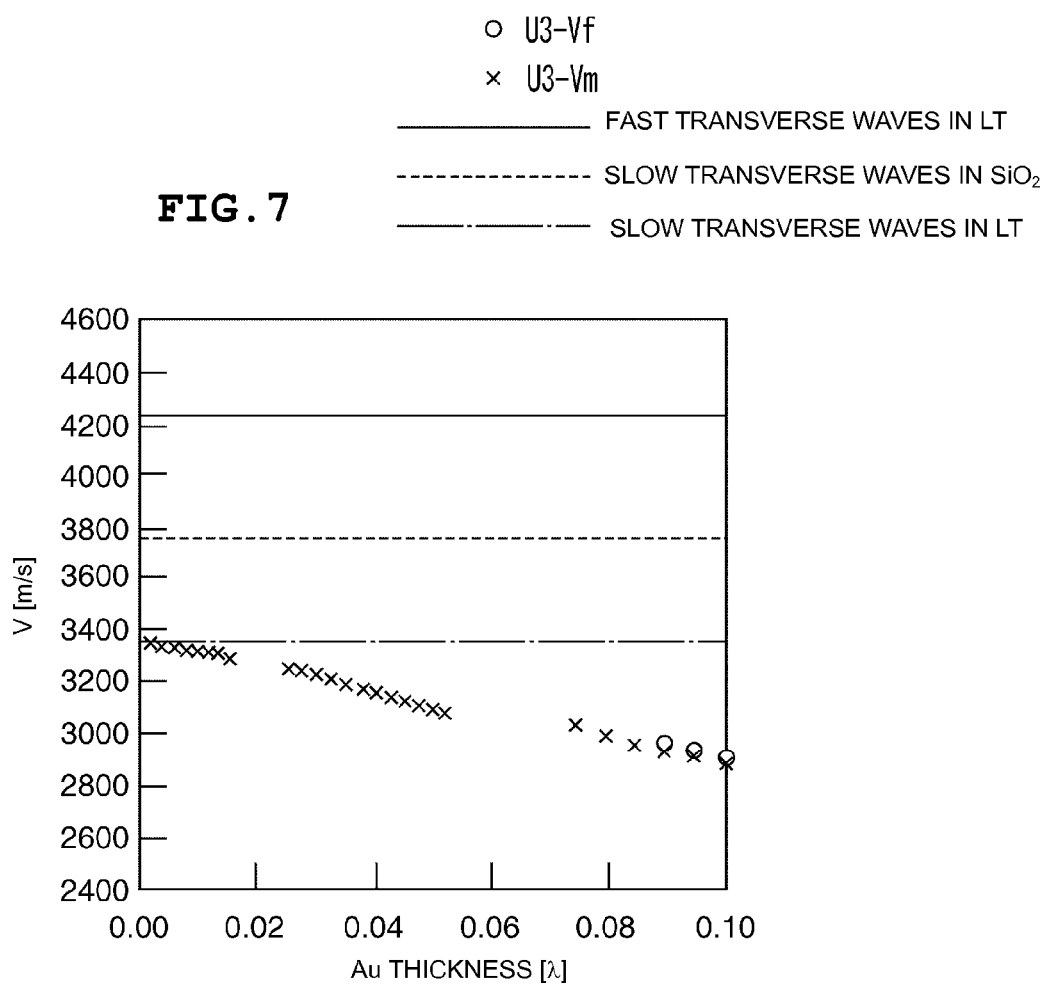
FIG. 7 is a plot showing the relationship between the thickness of the Au electrode and the acoustic velocity V of some types of waves in the structure including the Au electrode and the $SiO_2$ layer on the (0°, 90°, 0°) $LiTaO_3$ substrate.
Figure 8:
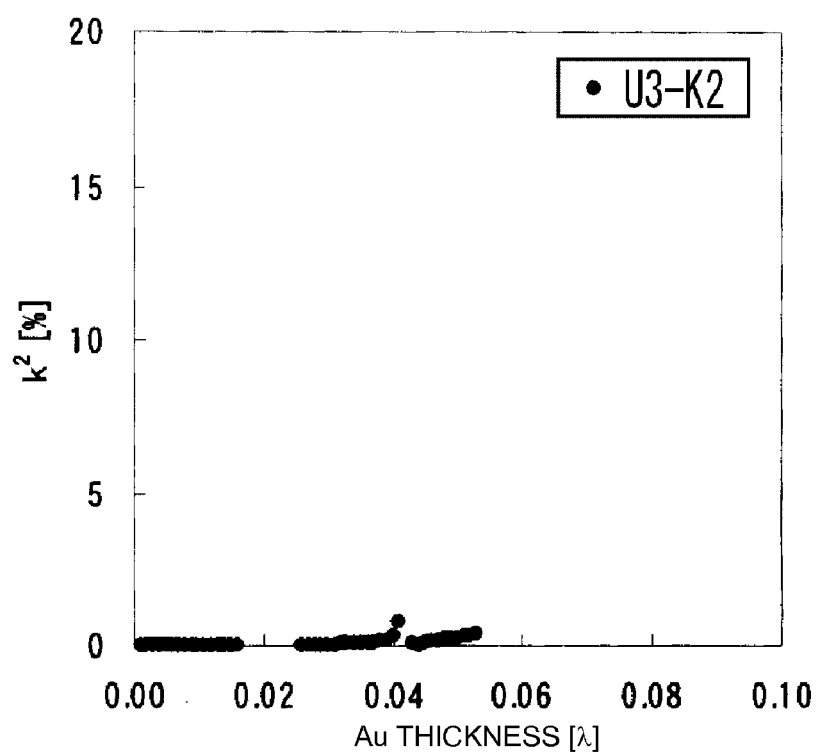
FIG. 8 is a plot showing the relationship between the thickness of the Au electrode and the electromechanical coupling coefficient $k^2$ of Stoneley wave (U3) in the structure including the Au electrode and the $SiO_2$ layer on the (0°, 90°, 0°) $LiTaO_3$ substrate.
Figure 9:
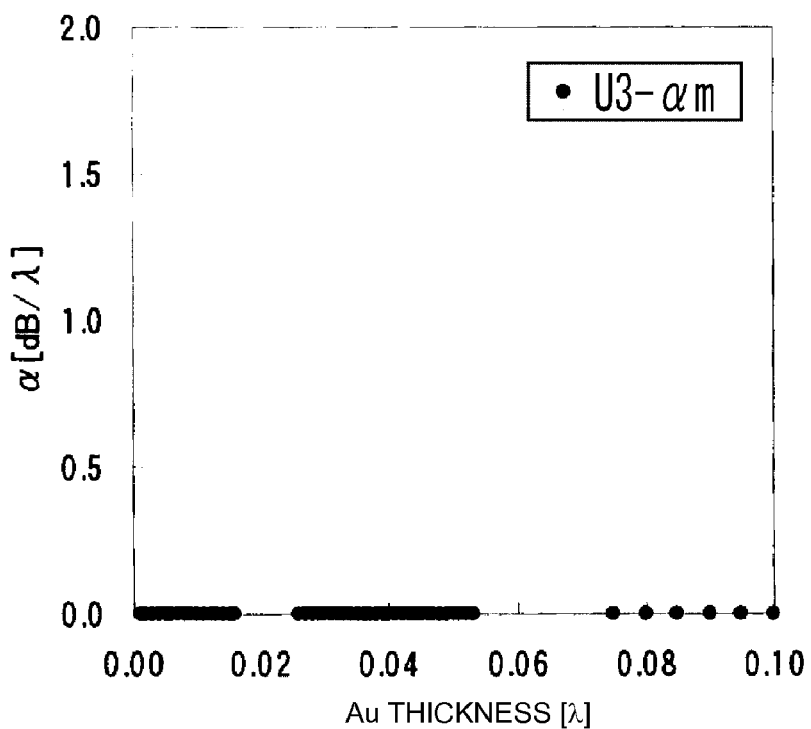
FIG. 9 is a plot showing the relationship between the thickness of the Au electrode and the propagation loss α of Stoneley wave (U3) in the structure including the Au electrode and the $SiO_2$ layer on the (0°, 90°, 0°) $LiTaO_3$ substrate.
Figure 10:
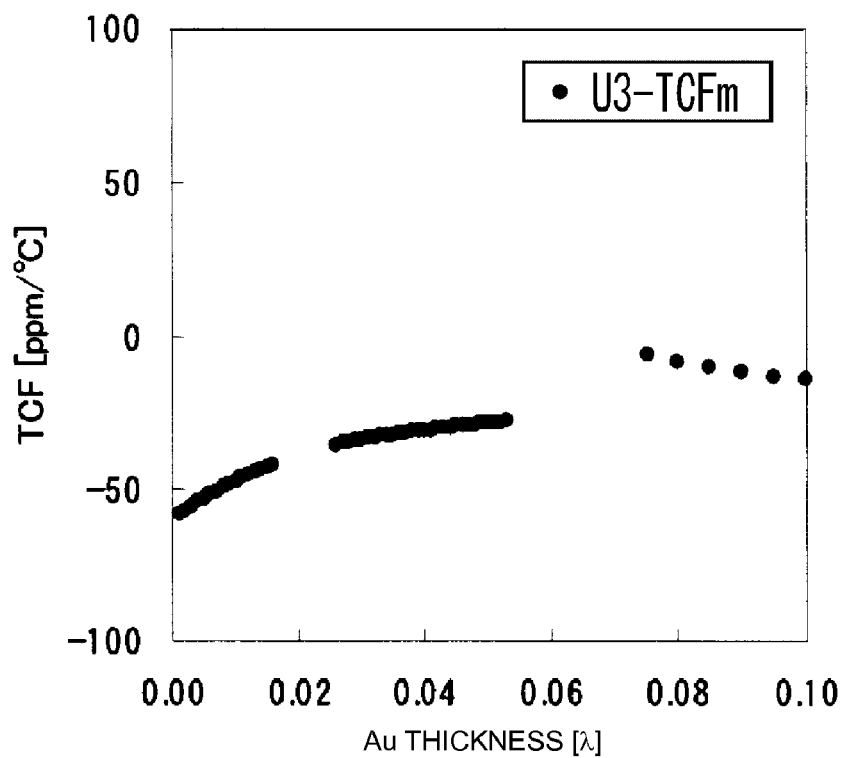
FIG. 10 is a plot showing the relationship between the thickness of the Au electrode and the frequency temperature coefficient TCF of Stoneley wave (U3) in the structure including the Au electrode and the $SiO_2$ layer on the (0°, 90°, 0°) $LiTaO_3$ substrate.
Figure 11:
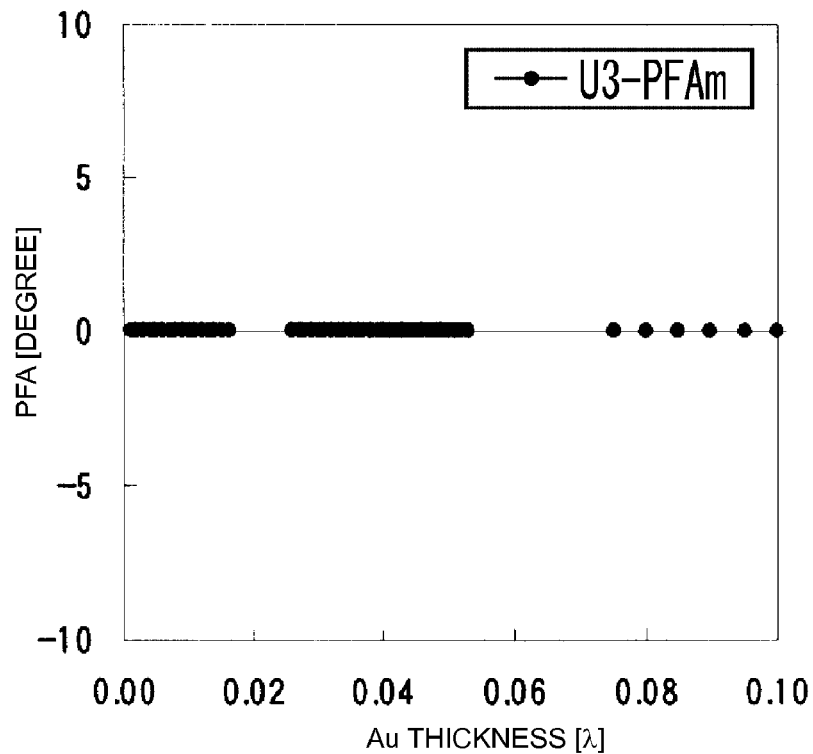
FIG. 11 is a plot showing the relationship between the thickness of the Au electrode and the power flow angle PFA of Stoneley wave (U3) in the structure including the Au electrode and the $SiO_2$ layer on the (0°, 90°, 0°) $LiTaO_3$ substrate.
Figure 12:
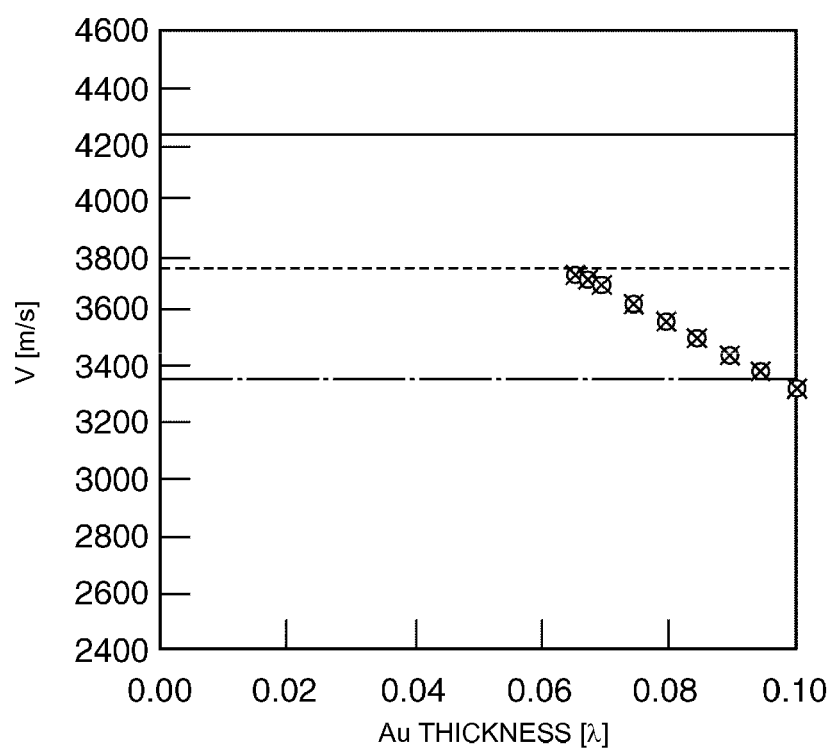
FIG. 12 is a plot showing the relationship between the thickness of the Au electrode and the acoustic velocity V of some types of waves in the structure including the Au electrode and the $SiO_2$ layer on the (0°, 90°, 0°) $LiTaO_3$ substrate.
Figure 13:
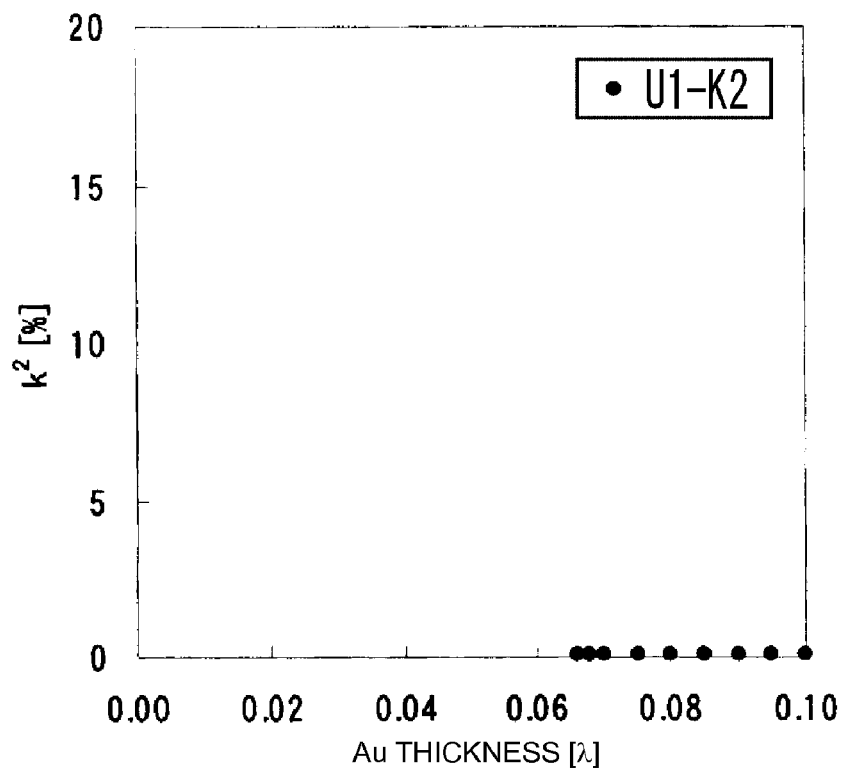
FIG. 13 is a plot showing the relationship between the thickness of the Au electrode and the electromechanical coupling coefficient $k^2$ of longitudinal boundary waves (U1) in the structure including the Au electrode and the $SiO_2$ layer on the (0°, 90°, 0°) $LiTaO_3$ substrate.
Figure 14:
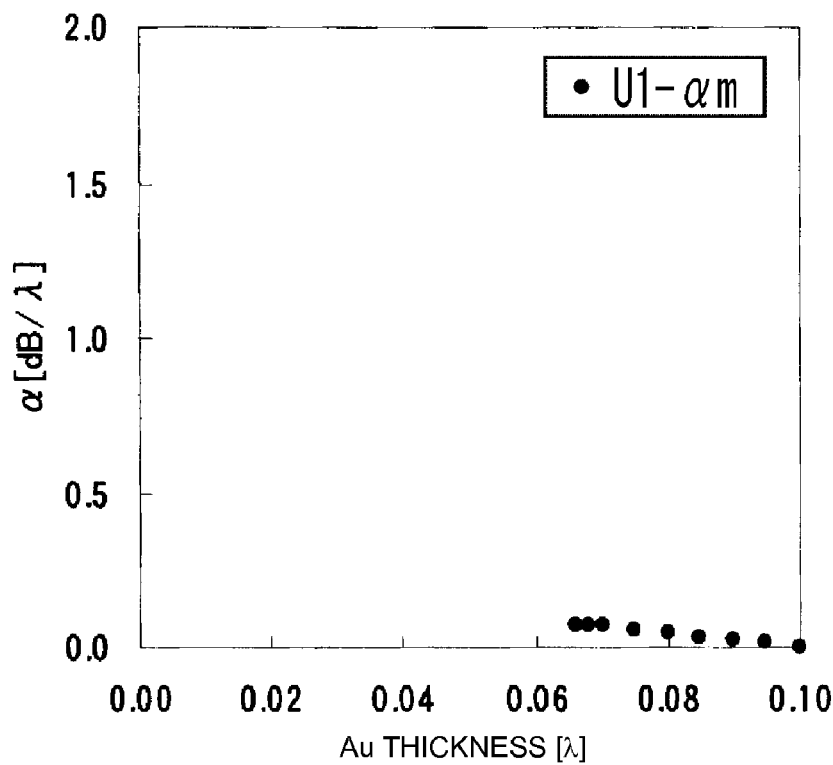
FIG. 14 is a plot showing the relationship between the thickness of the Au electrode and the propagation loss α of longitudinal boundary waves (U1) in the structure including the Au electrode and the $SiO_2$ layer on the (0°, 90°, 0°) $LiTaO_3$ substrate.
Figure 15:
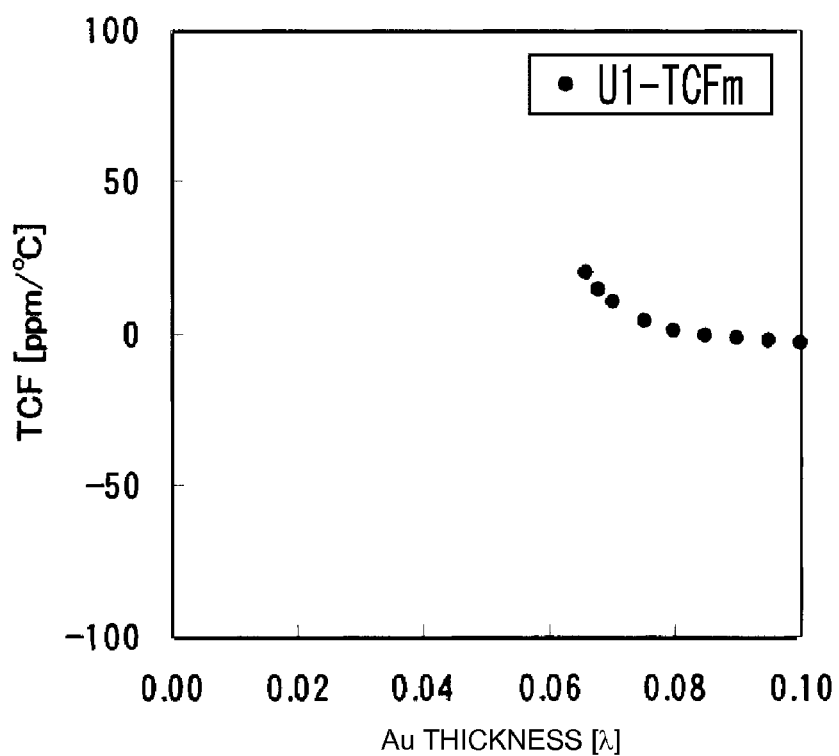
FIG. 15 is a plot showing the relationship between the thickness of the Au electrode and the frequency temperature coefficient TCF of longitudinal boundary waves (U1) in the structure including the Au electrode and the $SiO_2$ layer on the (0°, 90°, 0°) $LiTaO_3$ substrate.
Figure 16:
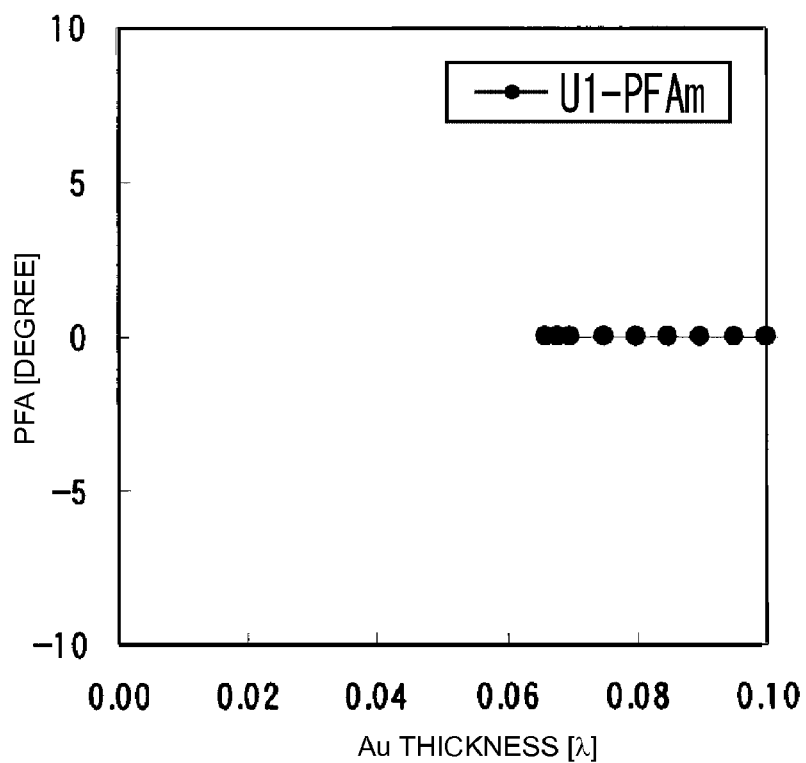
FIG. 16 is a plot showing the relationship between the thickness of the Au electrode and the power flow angle PFA of longitudinal boundary waves (U1) in the structure including the Au electrode and the $SiO_2$ layer on the (0°, 90°, 0°) $LiTaO_3$ substrate.
Figure 17:
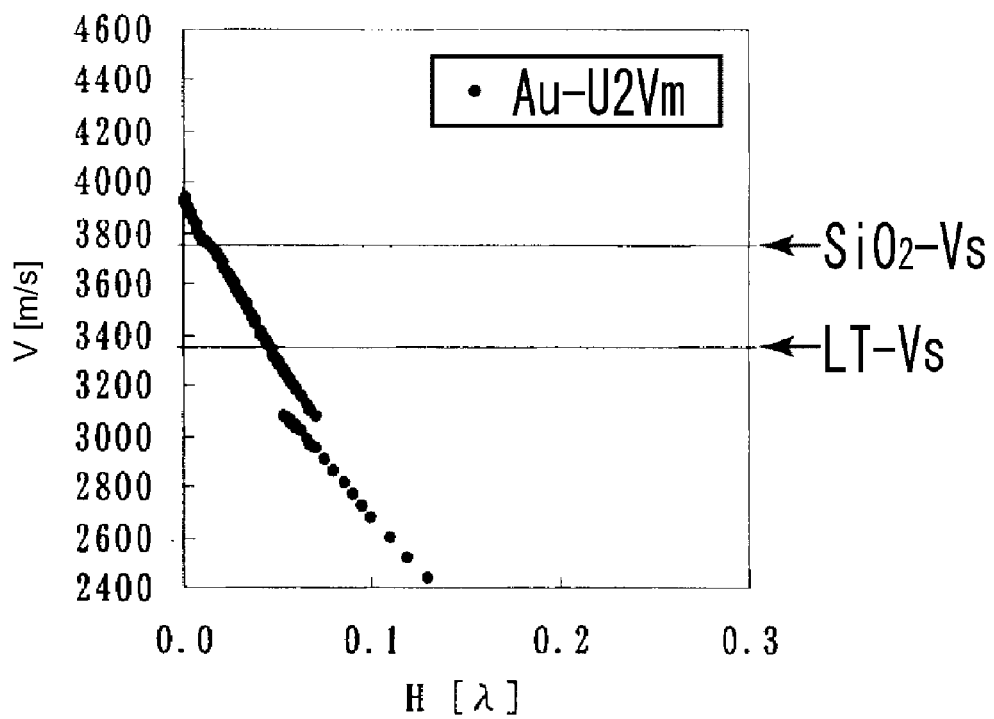
FIG. 17 is a plot showing the relationship between the thickness of the Au electrode and the acoustic velocity V of SH boundary waves in the structure including the Au electrode and the $SiO_2$ layer on the (0°, 90°, 0°) $LiTaO_3$ substrate.
Figure 18:
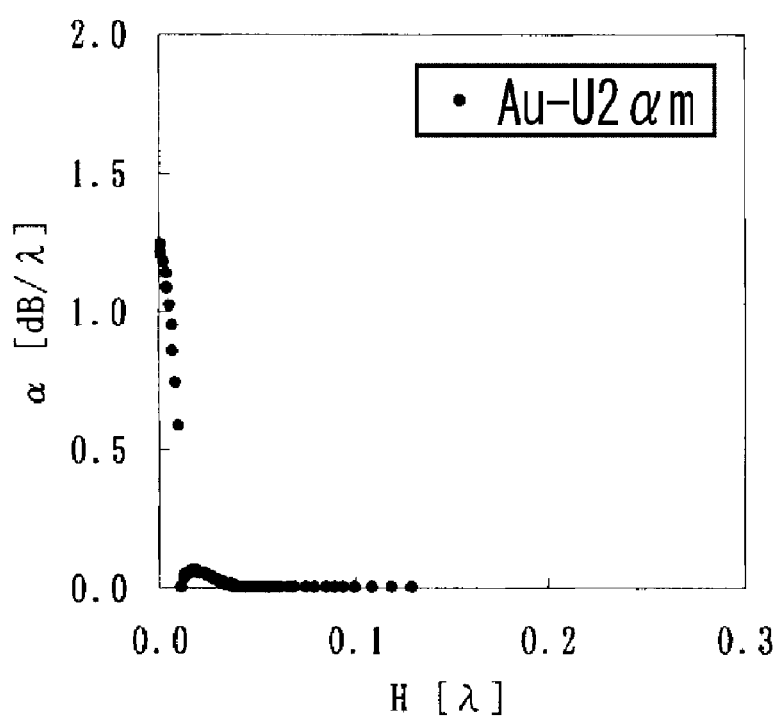
FIG. 18 is a plot showing the relationship between the thickness of the Au electrode and the propagation loss α of SH boundary waves (U2) in the structure including the Au electrode and the $SiO_2$ layer on the (0°, 90°, 0°) $LiTaO_3$ substrate.
Figure 19:
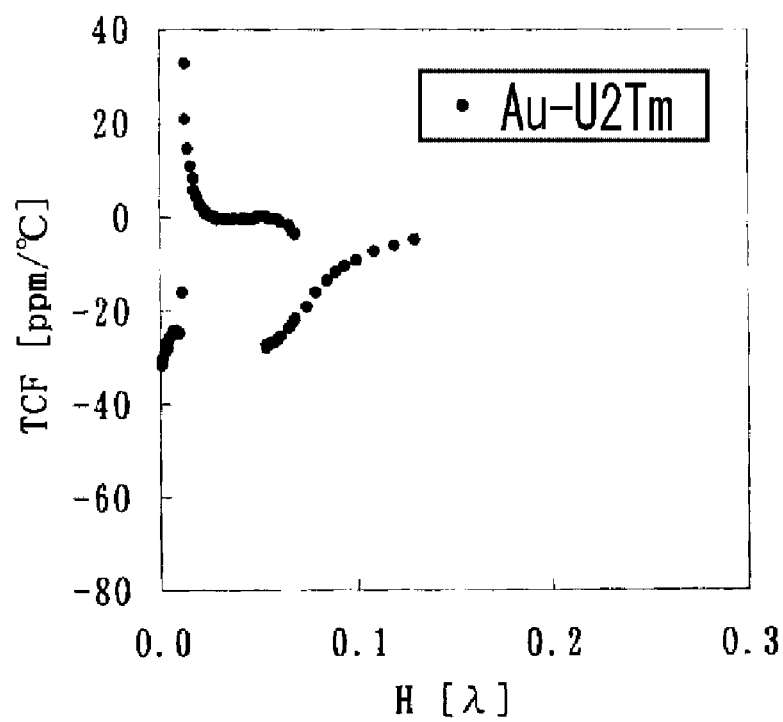
FIG. 19 is a plot showing the relationship between the thickness of the Au electrode and the frequency temperature coefficient TCF of SH boundary waves (U2) in the structure including the Au electrode and the $SiO_2$ layer on the (0°, 90°, 0°) $LiTaO_3$ substrate.
Figure 20:
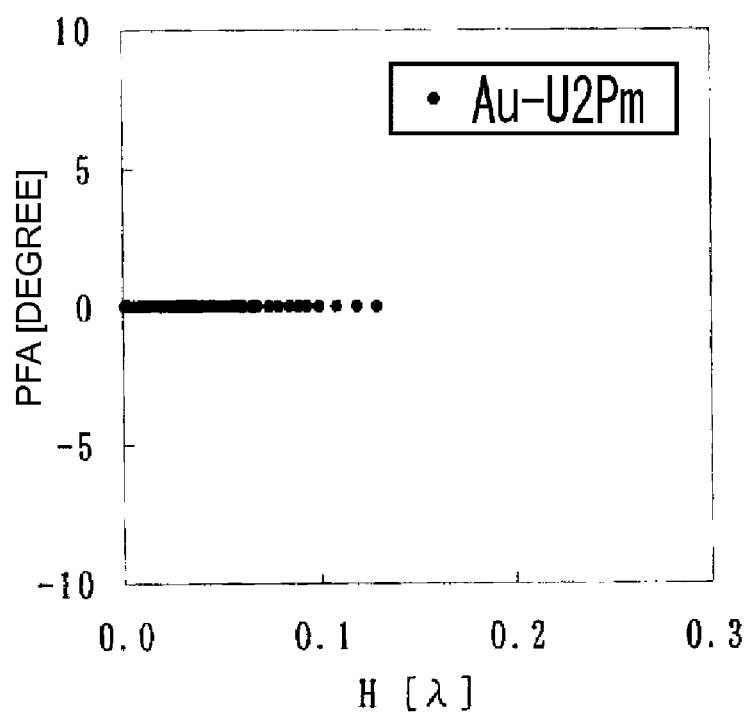
FIG. 20 is a plot showing the relationship between the thickness of the Au electrode and the power flow angle PFA of SH boundary waves (U2) in the structure including the Au electrode and the $SiO_2$ layer on the (0°, 90°, 0°) $LiTaO_3$ substrate.
Figure 21:
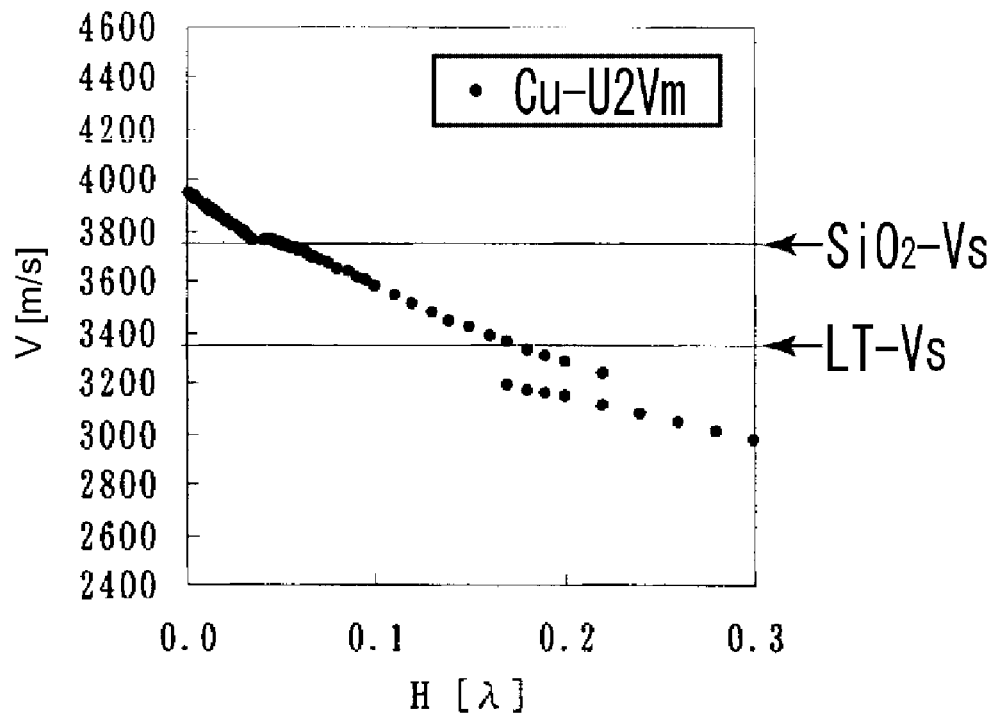
FIG. 21 is a plot showing the relationship between the thickness of a Cu electrode and the acoustic velocity V of SH boundary waves in a structure including the Cu electrode and a $SiO_2$ layer on a (0°, 90°, 0°) $LiTaO_3$ substrate.
Figure 22:
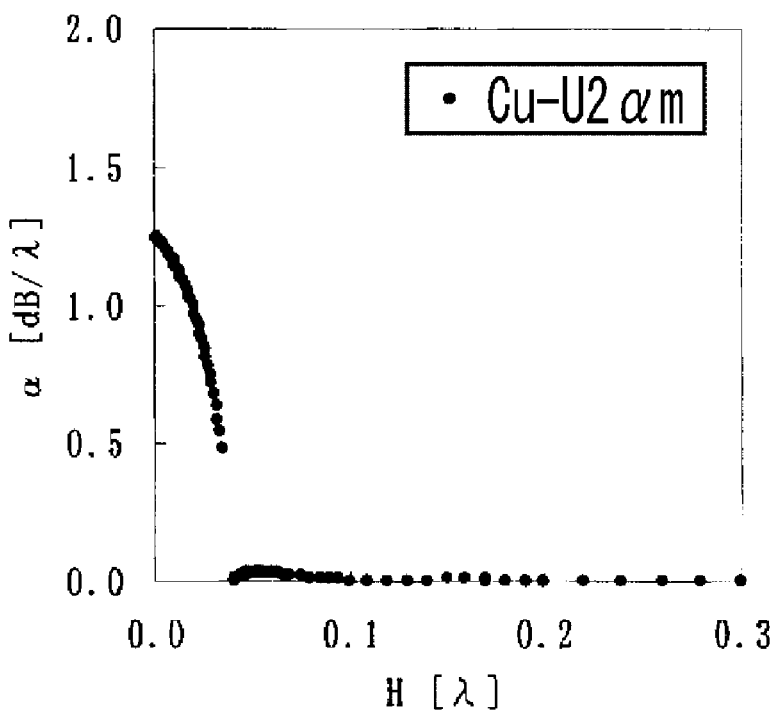
FIG. 22 is a plot showing the relationship between the thickness of the Cu electrode and the propagation loss α of SH boundary waves (U2) in the structure including the Cu electrode and the $SiO_2$ layer on the (0°, 90°, 0°) $LiTaO_3$ substrate.
Figure 23:
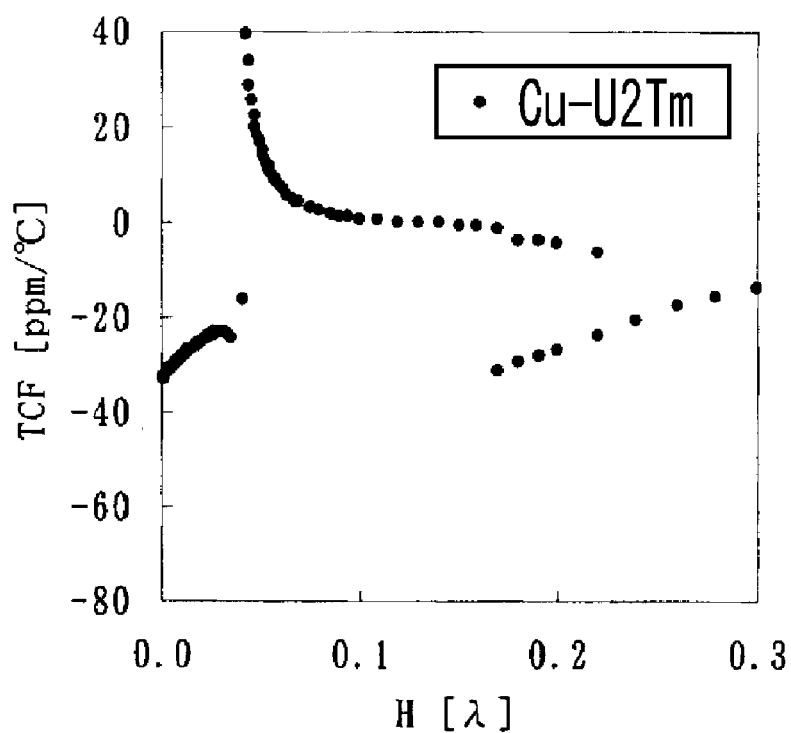
FIG. 23 is a plot showing the relationship between the thickness of the Cu electrode and the frequency temperature coefficient TCF of SH boundary waves (U2) in the structure including the Cu electrode and the $SiO_2$ layer on the (0°, 90°, 0°) $LiTaO_3$ substrate.
Figure 24:
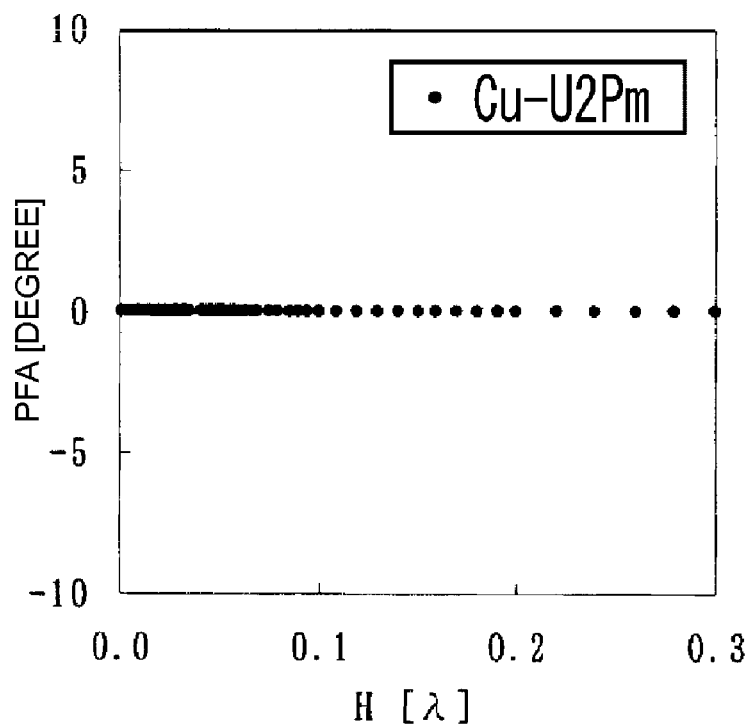
FIG. 24 is a plot showing the relationship between the thickness of the Cu electrode and the power flow angle PFA of SH boundary waves (U2) in the structure including the Cu electrode and the $SiO_2$ layer on the (0°, 90°, 0°) $LiTaO_3$ substrate.
Figure 25:
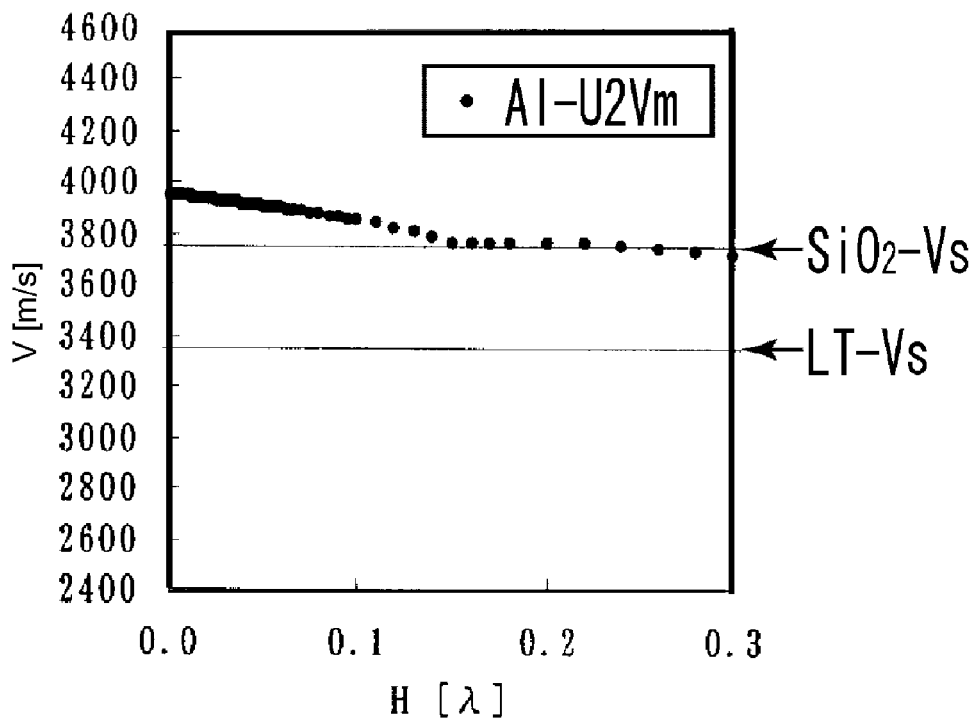
FIG. 25 is a plot showing the relationship between the thickness of an Al electrode and the acoustic velocity V of SH boundary waves in a structure including the Al electrode and a $SiO_2$ layer on a (0°, 90°, 0°) $LiTaO_3$ substrate.
Figure 26:
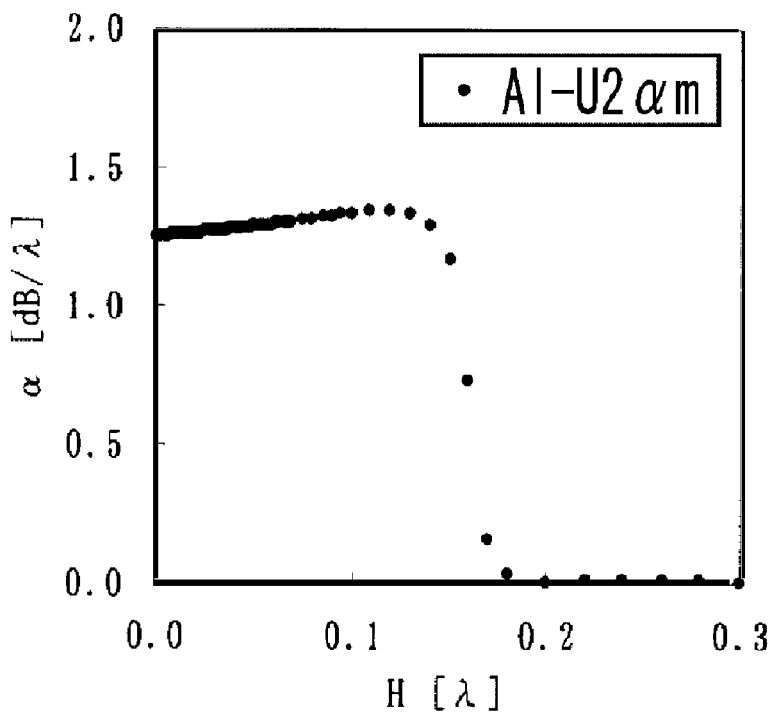
FIG. 26 is a plot showing the relationship between the thickness of the Al electrode and the propagation loss α of SH boundary waves (U2) in the structure including the Al electrode and the $SiO_2$ layer on the (0°, 90°, 0°) $LiTaO_3$ substrate.
Figure 27:
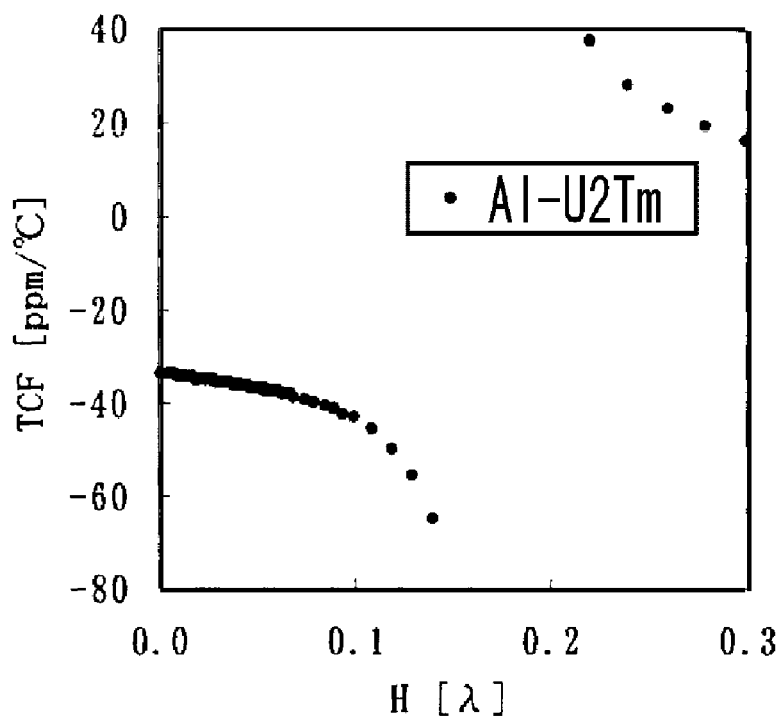
FIG. 27 is a plot showing the relationship between the thickness of the Al electrode and the frequency temperature coefficient TCF of SH boundary waves (U2) in the structure including the Al electrode and the $SiO_2$ layer on the (0°, 90°, 0°) $LiTaO_3$ substrate.
Figure 28:
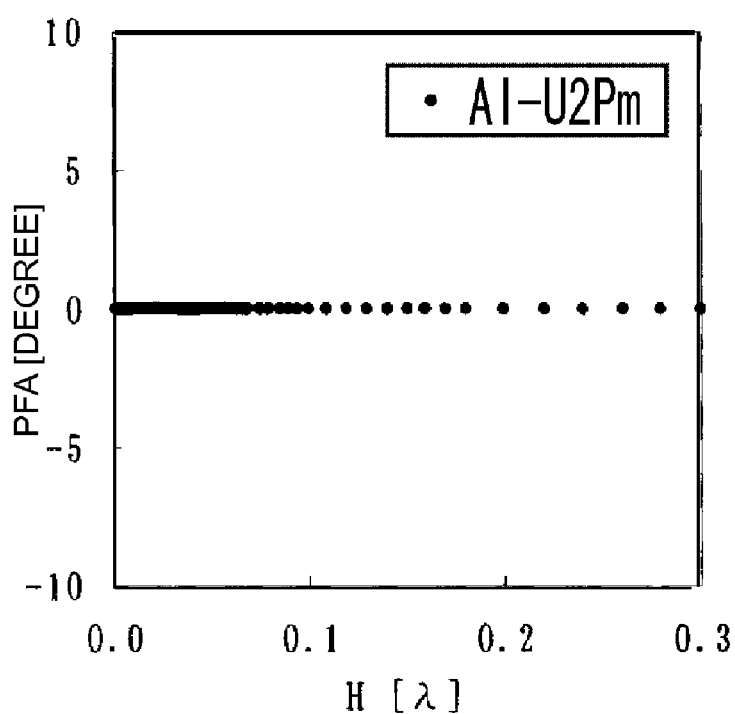
FIG. 28 is a plot showing the relationship between the thickness of the Al electrode and the power flow angle PFA of SH boundary waves (U2) in the structure including the Al electrode and the $SiO_2$ layer on the (0°, 90°, 0°) $LiTaO_3$ substrate.
Figure 29:
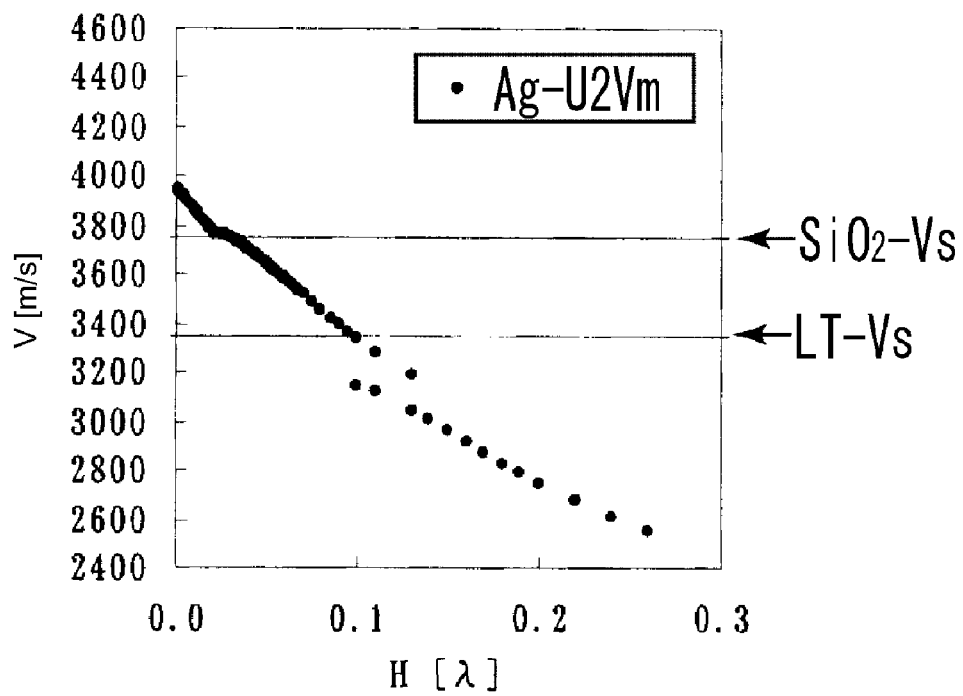
FIG. 29 is a plot showing the relationship between the thickness of a Ag electrode and the acoustic velocity V of SH boundary waves V in a structure including the Ag electrode and a $SiO_2$ layer on a (0°, 90°, 0°) $LiTaO_3$ substrate.
Figure 30:
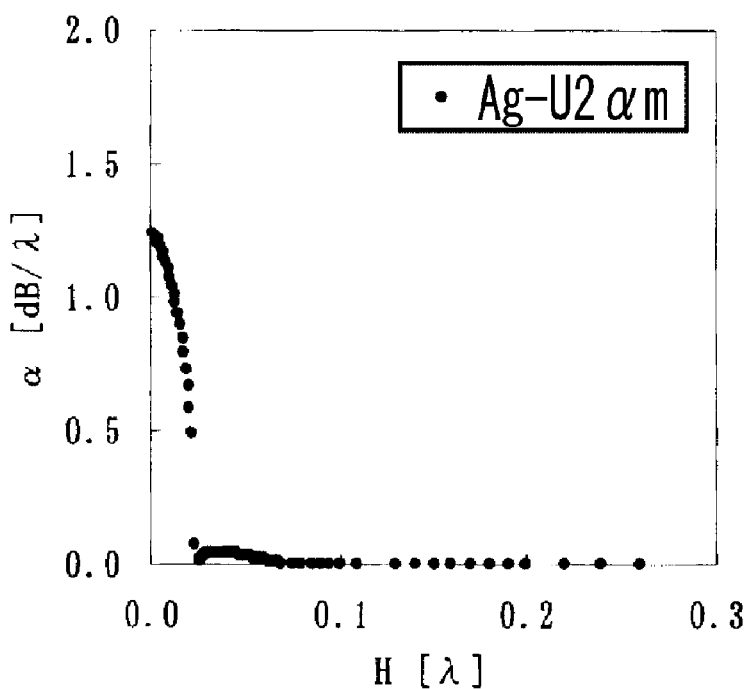
FIG. 30 is a plot showing the relationship between the thickness of the Ag electrode and the propagation loss α of SH boundary waves (U2) in the structure including the Ag electrode and the $SiO_2$ layer on the (0°, 90°, 0°) $LiTaO_3$ substrate.
Figure 31:
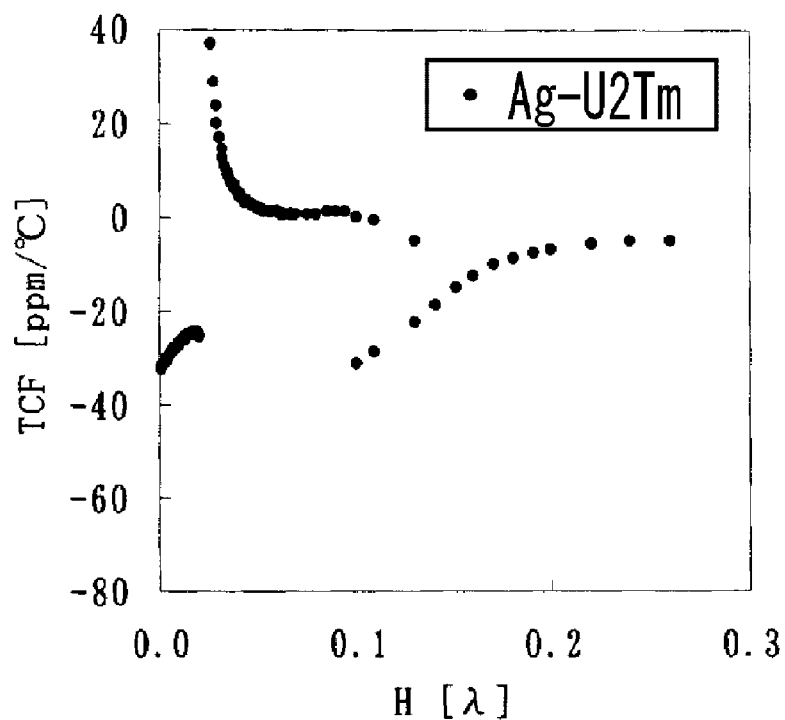
FIG. 31 is a plot showing the relationship between the thickness of the Ag electrode and the frequency temperature coefficient TCF of SH boundary waves (U2) in the structure including the Ag electrode and the $SiO_2$ layer on the (0°, 90°, 0°) $LiTaO_3$ substrate.
Figure 32:
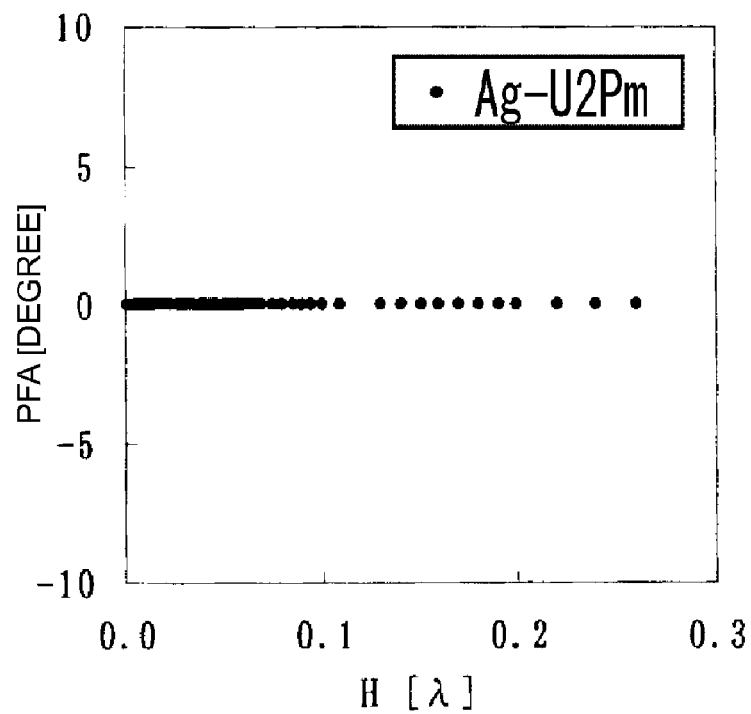
FIG. 32 is a plot showing the relationship between the thickness of the Ag electrode and the power flow angle PFA of SH boundary waves (U2) in the structure including the Ag electrode and the $SiO_2$ layer on the (0°, 90°, 0°) $LiTaO_3$ substrate.
Figure 33:
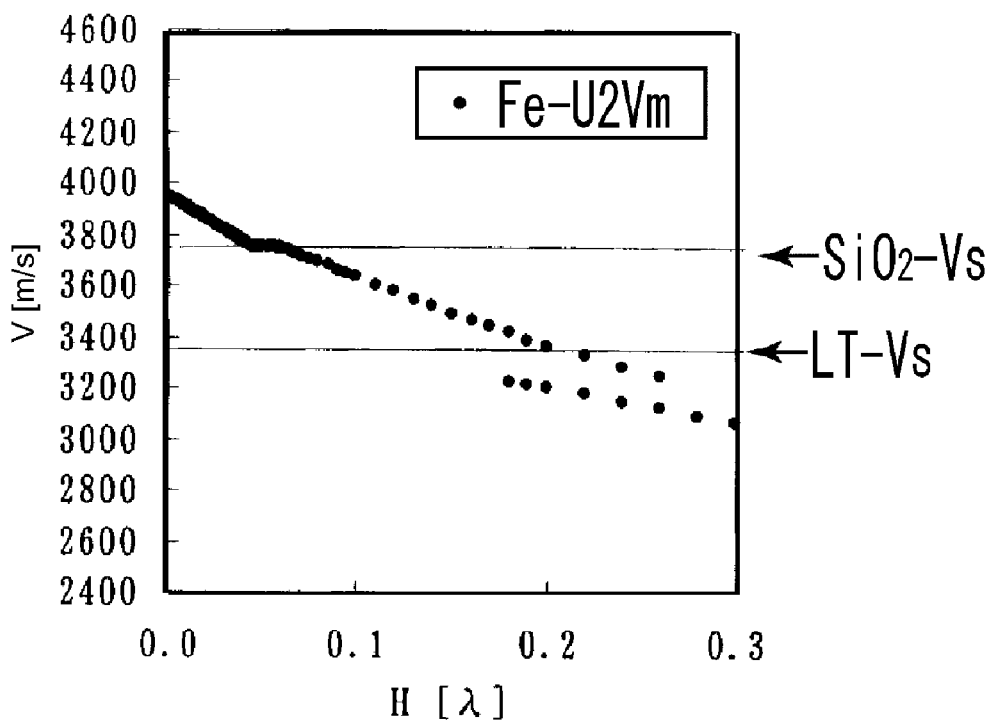
FIG. 33 is a plot showing the relationship between the thickness of an Fe electrode and the acoustic velocity V of SH boundary waves in a structure including the Fe electrode and a $SiO_2$ layer on a (0°, 90°, 0°) $LiTaO_3$ substrate.
Figure 34:
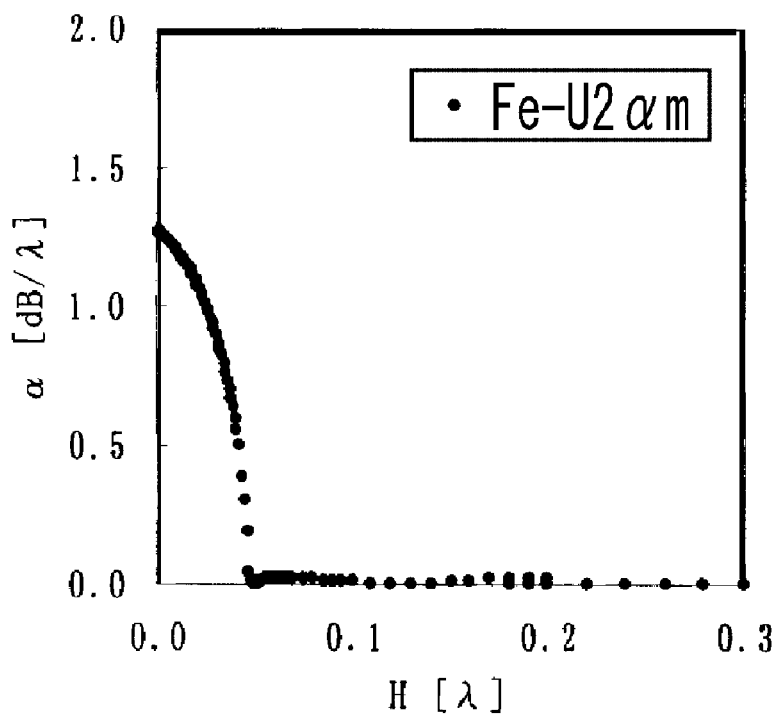
FIG. 34 is a plot showing the relationship between the thickness of the Fe electrode and the propagation loss α of SH boundary waves (U2) in the structure including the Fe electrode and the $SiO_2$ layer on the (0°, 90°, 0°) $LiTaO_3$ substrate.
Figure 35:
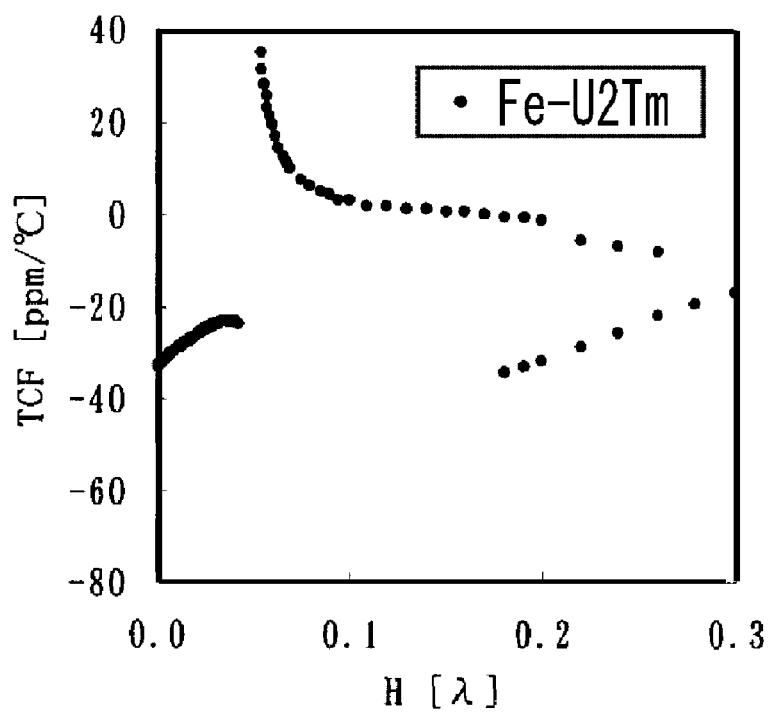
FIG. 35 is a plot showing the relationship between the thickness of the Fe electrode and the frequency temperature coefficient TCF of SH boundary waves (U2) in the structure including the Fe electrode and the $SiO_2$ layer on the (0°, 90°, 0°) $LiTaO_3$ substrate.
Figure 36:
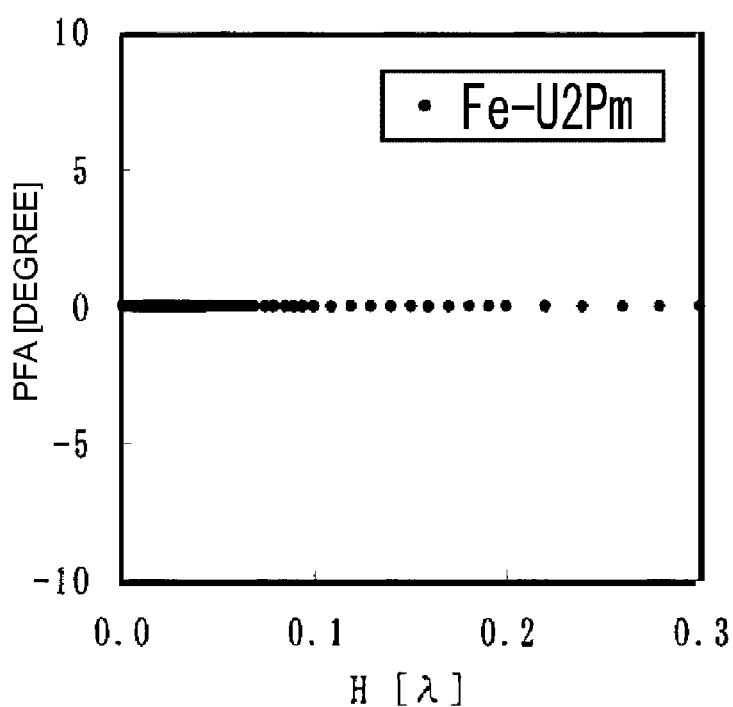
FIG. 36 is a plot showing the relationship between the thickness of the Fe electrode and the power flow angle PFA of SH boundary waves (U2) in the structure including the Fe electrode and the $SiO_2$ layer on the (0°, 90°, 0°) $LiTaO_3$ substrate.
Figure 37:
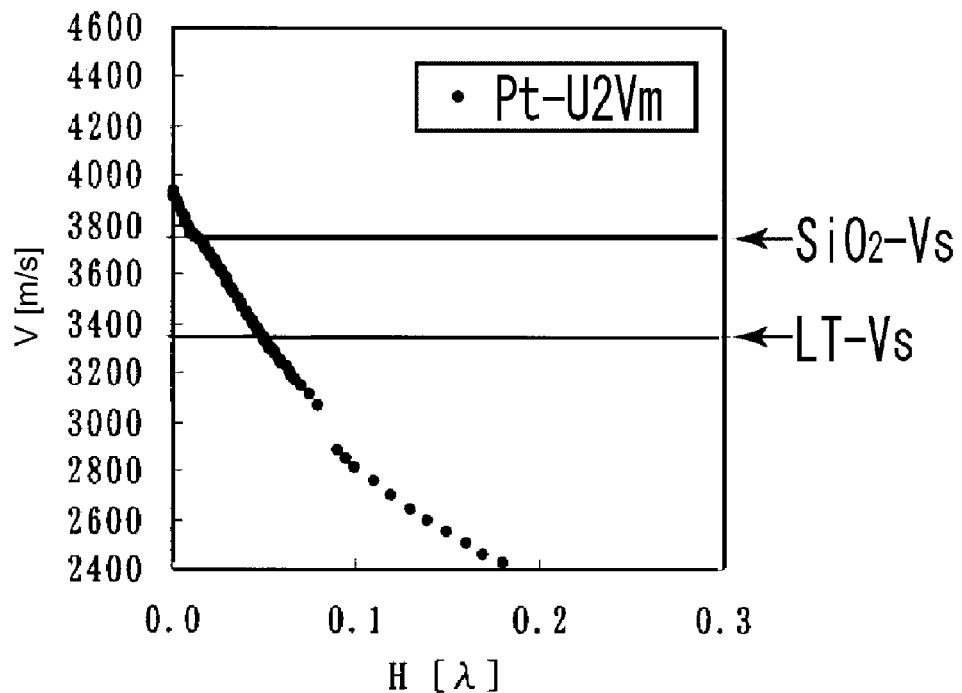
FIG. 37 is a plot showing the relationship between the thickness of a Pt electrode and the acoustic velocity V of SH boundary waves in a structure including the Pt electrode and a $SiO_2$ layer on a (0°, 90°, 0°) $LiTaO_3$ substrate.
Figure 38:
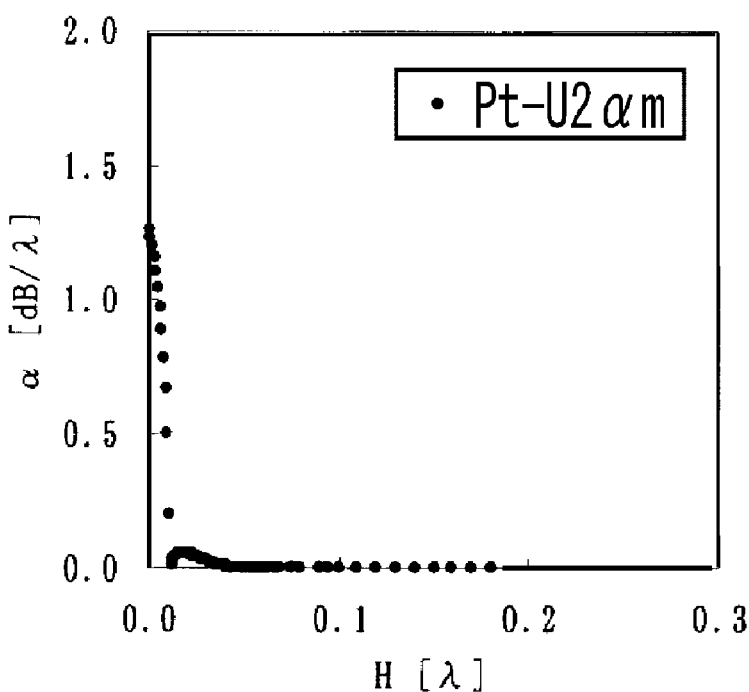
FIG. 38 is a plot showing the relationship between the thickness of the Pt electrode and the propagation loss α of SH boundary waves (U2) in the structure including the Pt electrode and the $SiO_2$ layer on the (0°, 90°, 0°) $LiTaO_3$ substrate.
Figure 39:
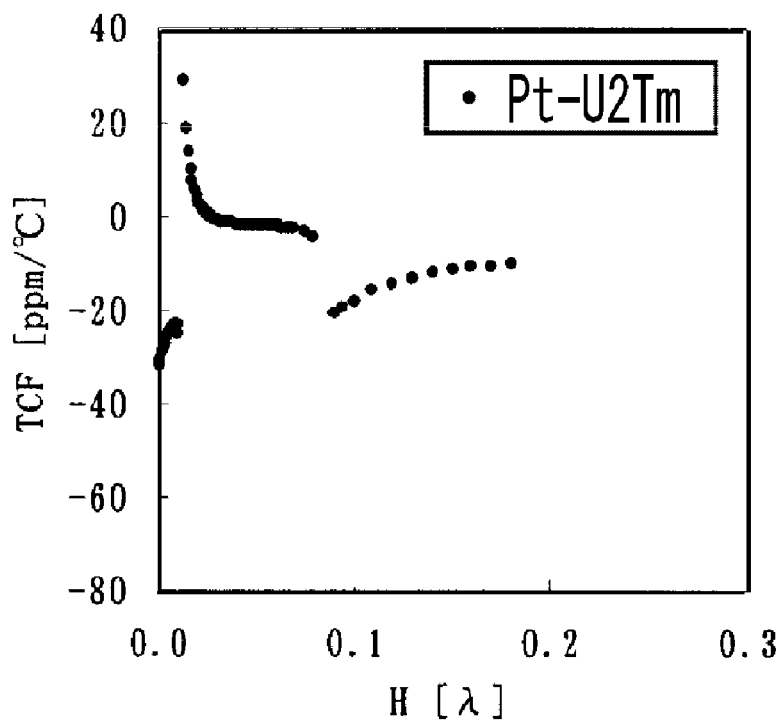
FIG. 39 is a plot showing the relationship between the thickness of the Pt electrode and the frequency temperature coefficient TCF of SH boundary waves (U2) in the structure including the Pt electrode and the $SiO_2$ layer on the (0°, 90°, 0°) $LiTaO_3$ substrate.
Figure 40:
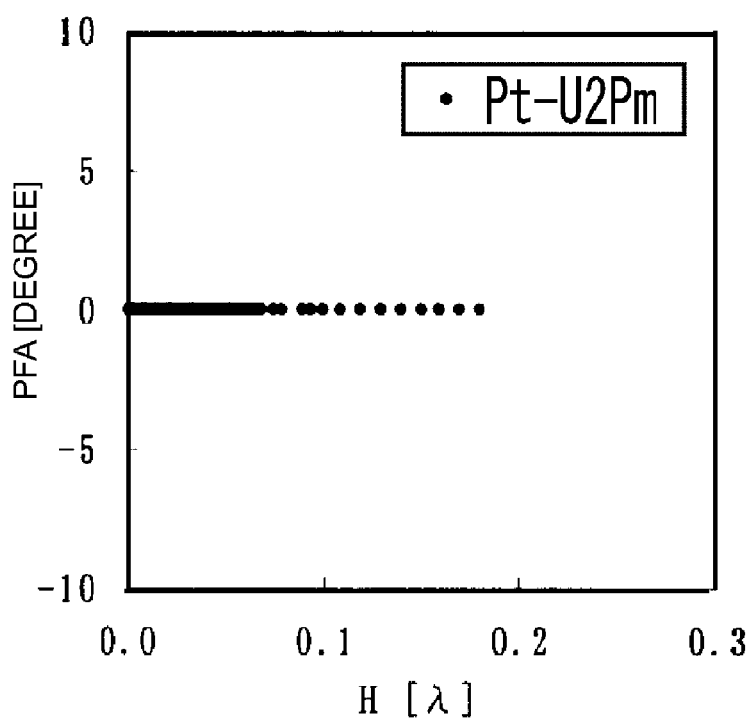
FIG. 40 is a plot showing the relationship between the thickness of the Pt electrode and the power flow angle PFA of SH boundary waves (U2) in the structure including the Pt electrode and the $SiO_2$ layer on the (0°, 90°, 0°) $LiTaO_3$ substrate.
Figure 41:
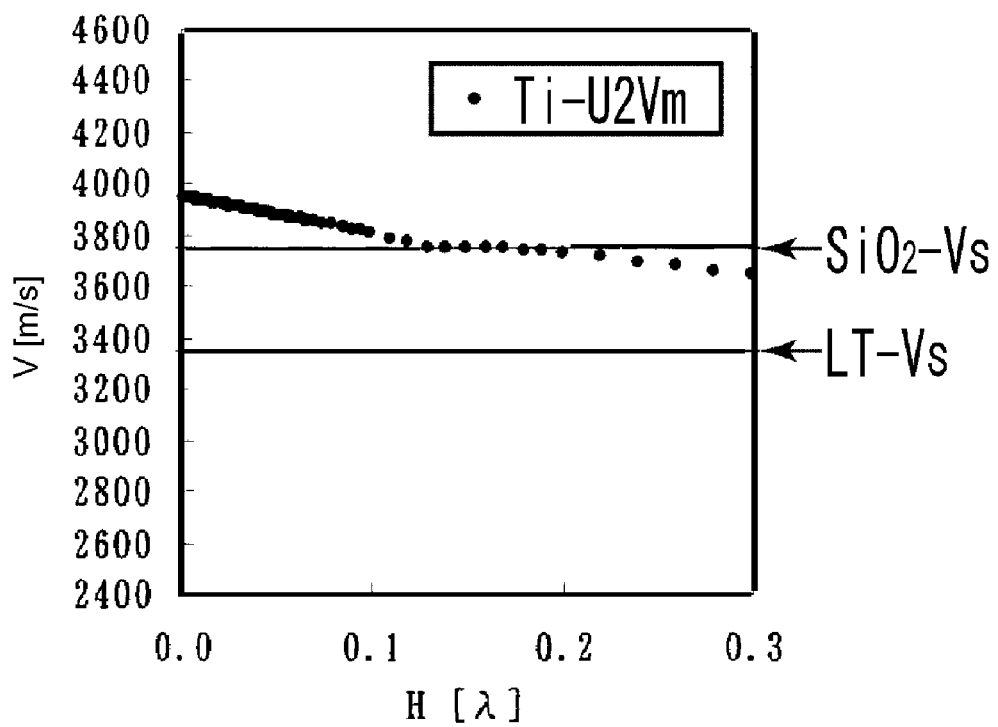
FIG. 41 is a plot showing the relationship between the thickness of a Ti electrode and the acoustic velocity V of SH boundary waves in a structure including the Ti electrode and a $SiO_2$ layer on a (0°, 90°, 0°) $LiTaO_3$ substrate.
Figure 42:
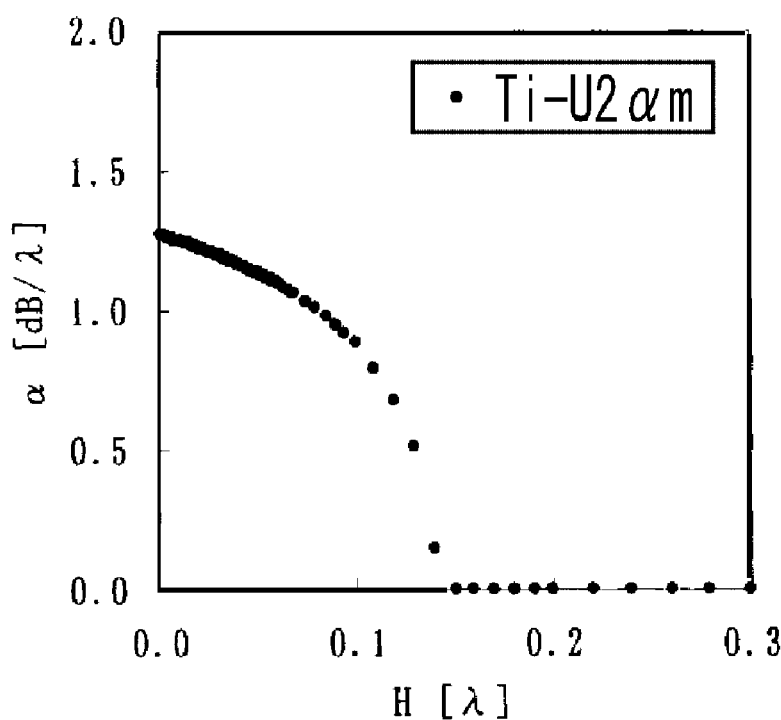
FIG. 42 is a plot showing the relationship between the thickness of the Ti electrode and the propagation loss α of SH boundary waves (U2) in the structure including the Ti electrode and the $SiO_2$ layer on the (0°, 90°, 0°) $LiTaO_3$ substrate.
Figure 43:
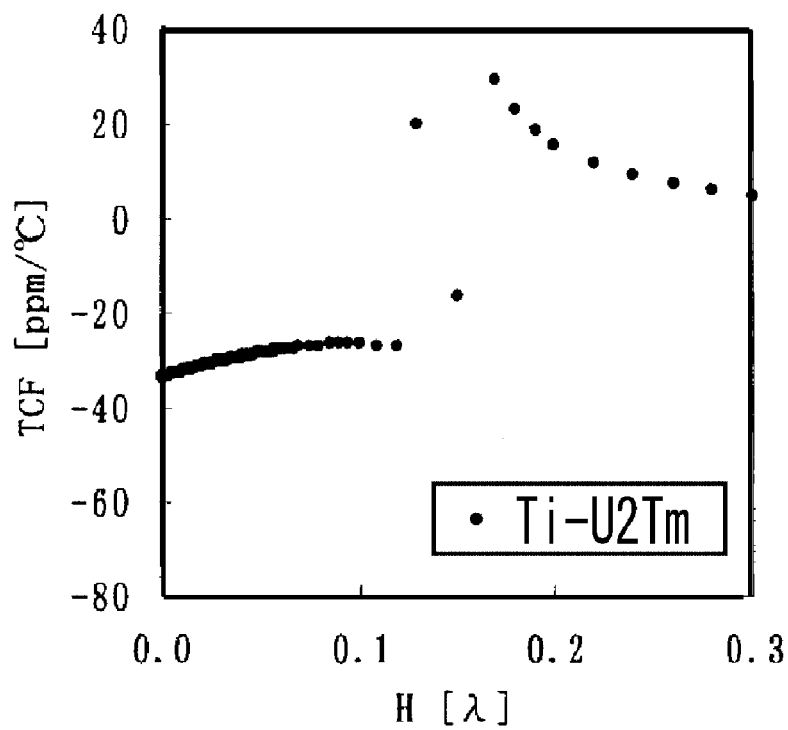
FIG. 43 is a plot showing the relationship between the thickness of the Ti electrode and the frequency temperature coefficient TCF of SH boundary waves (U2) in the structure including the Ti electrode and the $SiO_2$ layer on the (0°, 90°, 0°) $LiTaO_3$ substrate.
Figure 44:
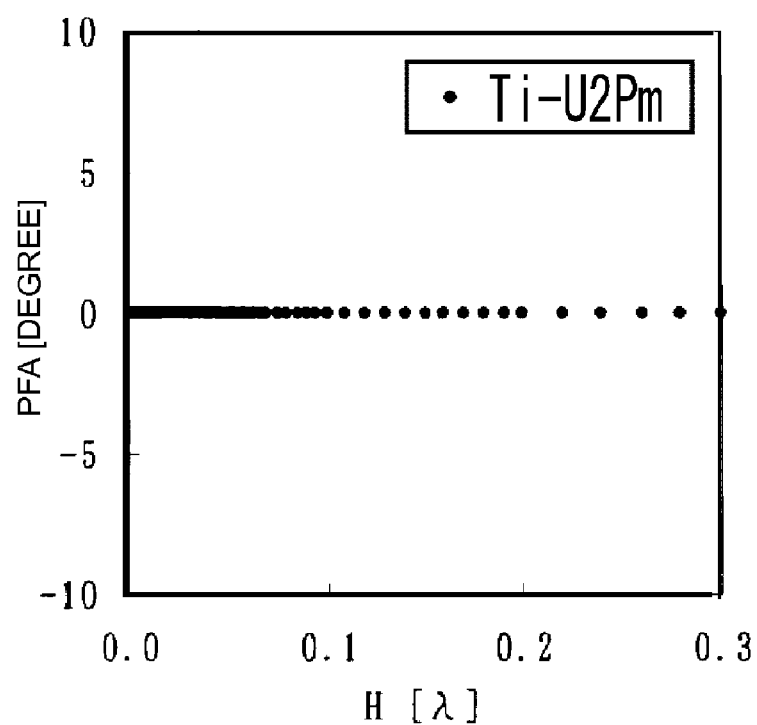
FIG. 44 is a plot showing the relationship between the thickness of the Ti electrode and the power flow angle PFA of SH boundary waves (U2) in the structure including the Ti electrode and the $SiO_2$ layer on the (0°, 90°, 0°) $LiTaO_3$ substrate.
Figure 45:
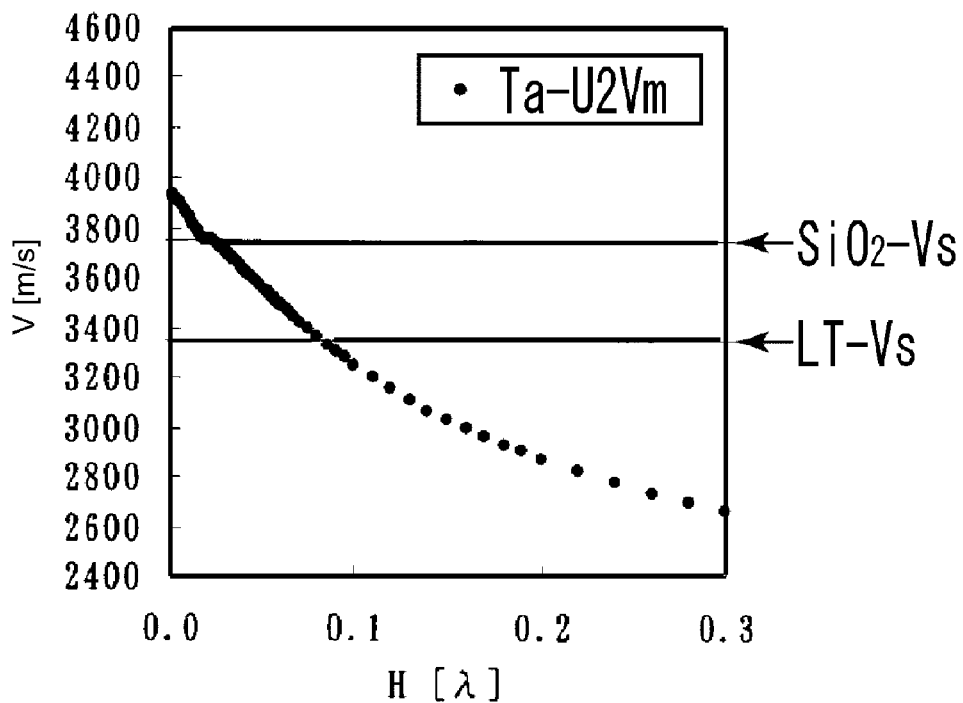
FIG. 45 is a plot showing the relationship between the thickness of a Ta electrode and the acoustic velocity V of SH boundary waves in a structure including the Ta electrode and a $SiO_2$ layer on a (0°, 90°, 0°) $LiTaO_3$ substrate.
Figure 46:
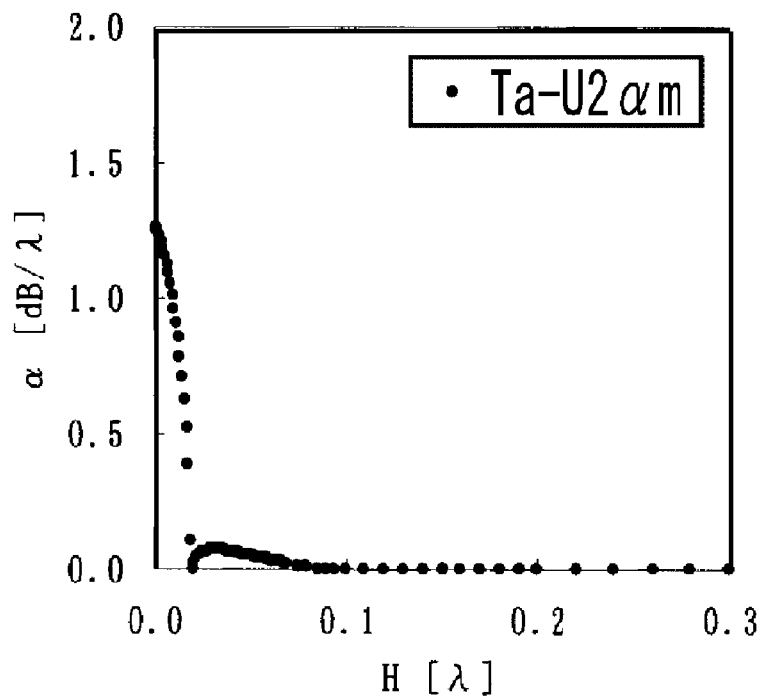
FIG. 46 is a plot showing the relationship between the thickness of the Ta electrode and the propagation loss α of SH boundary waves (U2) in the structure including the Ta electrode and the $SiO_2$ layer on the (0°, 90°, 0°) $LiTaO_3$ substrate.
Figure 47:
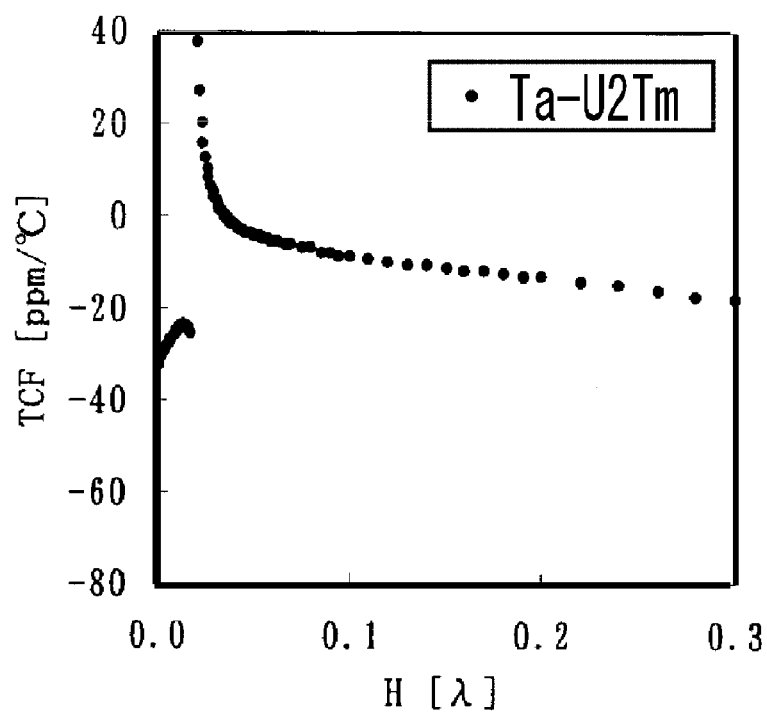
FIG. 47 is a plot showing the relationship between the thickness of the Ta electrode and the frequency temperature coefficient TCF of SH boundary waves (U2) in the structure including the Ta electrode and the $SiO_2$ layer on the (0°, 90°, 0°) $LiTaO_3$ substrate.
Figure 48:
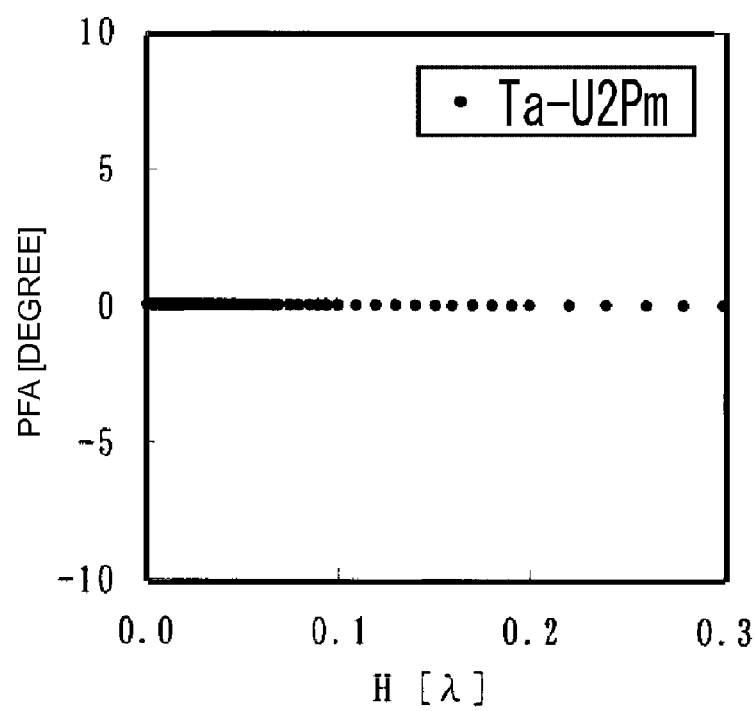
FIG. 48 is a plot showing the relationship between the thickness of the Ta electrode and the power flow angle PFA of SH boundary waves (U2) in the structure including the Ta electrode and the $SiO_2$ layer on the (0°, 90°, 0°) $LiTaO_3$ substrate.

Preferred embodiments of the present invention will be described with reference to the drawings.

In order to propagate boundary acoustic waves between two solid layers, it is necessary to satisfy the requirements for concentrating the energy of boundary waves on the boundary between the solid layers. For this purpose, Non-Patent Document 3 has disclosed a method in which a material is selected which enables the transverse wave velocity in a BGSW substrate to be close to the transverse wave velocity in an isotropic material, and which has a low density ratio to the isotropic material, and moreover which is highly piezoelectric, as described above.

When a material has a high velocity region and a low velocity region, waves are propagated primarily on the low acoustic velocity region. The inventors of the present invention have discovered that the requirements for concentrating the energy on the boundary between the solid layers are satisfied by using a metal having a high density and a low acoustic velocity, such as Au, for an electrode disposed between the two solid layers, and by increasing the thickness of the electrode to reduce the acoustic velocity of the boundary waves propagating between the solid layers.

It has been known that bulk waves propagating in a solid material include three type waves: longitudinal waves; fast transverse waves; and slow transverse waves, which are called P waves, SH waves, and SV waves, respectively. Which waves of the SH waves and the SV waves are slow depends on the anisotropy of the substrate. The bulk waves having the lowest acoustic velocity of these three type bulk waves are the slow transverse waves. If the solid material is isotropic, such as $SiO_2$, a single type of transverse wave is propagated. In this instance, this type of transverse wave is the slow transverse wave.

Boundary acoustic waves propagating along an anisotropic substrate, such as a piezoelectric substrate, generally propagate with the three displacement components combined: P waves, SH waves, and SV waves, and the principal component determines the type of the boundary acoustic waves. For example, the above-mentioned Stoneley waves are boundary acoustic waves primarily including P waves and SV waves, and SH boundary waves primarily include SH waves. In some cases, the SH waves and the P or SV waves may propagate without combining with each other.

Since boundary acoustic waves propagate with the three displacement components combined with each other, boundary acoustic waves, for example, with a higher acoustic velocity than SH waves leak the SH-wave and SV-wave components. Boundary acoustic waves with a higher acoustic velocity than SV waves also leak the SV-wave component. These leaked components cause the propagation loss of the boundary waves.

Accordingly, by reducing the acoustic velocity of the SH boundary waves to less than the acoustic velocities of slow transverse waves in the two solid layers, the energy of the SH boundary waves is concentrated on the electrode disposed between the two solid layers, and thus, SH boundary waves with a high electromechanical coupling coefficient $k^2$ are propagated. Thus, the requirements for making the propagation loss approximately zero are satisfied. The present invention is based on this concept.

In addition, by designing the two solid layers such that at least one of the solid layers is made of a piezoelectric body and the other solid layer is made of a dielectric body including a piezoelectric material, the electrode between the solid layers excites the SH boundary waves. In this instance, a comb-like or Japanese bamboo screen-like electrode (interdigital transducer, IDT) may be used as the electrode, as described in, for example, "Introduction of Surface Acoustic Wave (SAW) Device Simulation" (in Japanese, Hashimoto, Realize Corp., p. 9).

FIG. 1 is a schematic front sectional view of a boundary acoustic wave device according to a preferred embodiment of the present invention. The boundary acoustic wave device 1 includes a piezoelectric body 2 made of a $LiTaO_3$ plate and a dielectric body 3 disposed on the piezoelectric body. An IDT 4 and reflectors 5 and 6 are disposed at the boundary between the piezoelectric body 2 and the dielectric body 3.

The reflectors 5 and 6 are located on both sides in the surface wave propagation direction of the IDT 4. Thus, the present preferred embodiment is a boundary wave resonator.

In the boundary acoustic wave device 1 of the present preferred embodiment features, the thickness of the electrode, that is, the IDT 4 and the reflectors 5 and 6, is set. Specifically, the thickness of the electrode is set so that the acoustic velocity of SH boundary acoustic waves is less than the acoustic velocities of slow transverse waves propagating in the dielectric body 3 and slow transverse waves propagating in the $LiTaO_3$ piezoelectric body 2.

In the present preferred embodiment, the thickness of the electrode is increased to reduce the acoustic velocity of the SH boundary acoustic waves to less than the acoustic velocities of slow transverse waves propagating in the piezoelectric body 2 and in the dielectric body 3. Consequently, the energy of the SH boundary waves is concentrated on the boundary between the piezoelectric body 2 and the dielectric body 3. Thus, SH boundary waves with a high electromechanical coupling coefficient $k^2$ can be propagated with a low propagation loss.

In addition to the decrease in electrode thickness to propagate SH boundary waves, the duty ratio of the strips defining the electrode is controlled to reduce the acoustic velocity of SH boundary acoustic waves to less than the acoustic velocities of the slow transverse waves propagating in the piezoelectric body 2 and the dielectric body 3, as described below. Thus, the present invention enables the SH boundary waves to be concentrated on the boundary.

The present invention will be further described in detail with reference to experimental examples.

EXAMPLE 1

An $LiTaO_3$ substrate with Euler angles of (0°, 90°, 0°), that is a Y-plate X-propagating $LiTaO_3$ substrate, was prepared as the piezoelectric body 2. This $LiTaO_3$ substrate is highly piezoelectric. The dielectric body 3 was formed of $SiO_2$. $SiO_2$ is easy to form into a thin layer. The boundary wave device structured according to preferred embodiments of the present invention propagates boundary waves while distributing a portion of the vibrational energy in the $LiTaO_3$ substrate and the $SiO_2$ body. Since the $SiO_2$ body has a positive frequency temperature coefficient TCF that cancels the negative TCF of the $LiTaO_3$ substrate, the temperature dependence is improved.

The relationships were examined between the thickness of the electrodes and the acoustic velocity V, electromechanical coupling coefficient $k^2$, propagation loss α, frequency temperature coefficient TCF, and power flow angle PFA, using electrodes made of various materials having different densities between the piezoelectric body 2 and the dielectric body 3.

FIGS. 2 to 6, FIGS. 7 to 11, and FIGS. 12 to 16 show the results of the examination using Au electrodes. FIGS. 2 to 6 show the results for SH boundary waves (abbreviated as U2); FIGS. 7 to 11 shows the results for Stoneley waves (abbreviated as U3); and FIGS. 12 to 16 show the results for longitudinal boundary waves (abbreviated as U1).

FIGS. 17 to 20, FIGS. 21 to 24, FIGS. 25 to 28, FIGS. 29 to 32, FIGS. 33 to 36, FIGS. 37 to 40, FIGS. 41 to 44, and FIGS. 45 to 48 show the results of the examination using electrodes formed of Au, Cu, Al, Ag, Fe, Mo, Ni, Pt, Ti, Ta, and W respectively.

In these figures, U2 represents SH boundary waves, Vm represents an acoustic velocity at a short-circuited boundary, and Vf represents an acoustic velocity at an open boundary.

Also, Vs represents an acoustic velocity of slow transverse waves, LT is the abbreviation of LiTaO$_3$, and α represents a propagation loss. For example, Au-U2αm means the propagation loss of SH boundary acoustic waves at a short-circuited boundary with an Au electrode; Au-U2Tm means the frequency temperature coefficient TCF of SH boundary acoustic waves at a short-circuited boundary with an Au electrode; Au-U2Pm means the power flow angle PFA of SH boundary acoustic waves at a short-circuited boundary with an Au electrode.

The results shown in FIGS. 2 to 16 are derived from the calculations in accordance with a document "A Method For Estimating Optimal Cuts and Propagation Directions For Excitation and Propagation Directions for Excitation of Piezoelectric Surface Waves" (J. J. Campbell and W. R. Jones, IEEE Trans. Sonics and Ultrason., Vol. SU-15 (1968) pp. 209-217).

For the open boundary, the acoustic velocity and the propagation loss were calculated assuming that each component of the displacement, the potential, and the electric flux density in the direction of the normal, and the stress in the vertical direction are continuous at each of the boundaries between SiO$_2$ and Au and between Au and LiTaO$_3$, and that the thicknesses of the SiO$_2$ and the LiTaO$_3$ are infinity and the Au has a relative dielectric constant of 1. For the short-circuited boundary, the potentials at the boundaries between the SiO$_2$ and the Au and between the Au and LiTaO$_3$ were assumed to be 0. The electromechanical coupling coefficient k$^2$ was derived from the following Equation (1):

$$k^2 = 2 \times |Vf - V|/Vf \quad (1)$$

where Vf represents acoustic velocity at the open boundary.

The frequency temperature coefficient TCF was derived from the flowing Equation (2) using phase velocities V at 20° C., 25° C., and 30° C.:

$$TCF = V_{(25° C.)}^{-1} \times [(V(30° C.) - V(20° C.))/10° C.] - \alpha s \quad \text{Equation (2)}$$

where αS represents the linear expansion coefficient of the LiTaO$_3$ substrate in the propagation direction of boundary waves.

The power flow angle PFA at Euler angles (φ, θ, ψ) was derived from the following Equation (3) using phase velocities V at ψ−0.5°, ψ, and ψ+0.5°:

$$PFA = \tan^{-1}[V(\psi)^{-1} \times (V(\psi+0.5°) - V(\psi-0.5°))] \quad \text{Equation (3)}$$

The acoustic velocities of longitudinal waves, fast transverse waves, and slow transverse waves in the Y-plate X-propagating LiTaO$_3$ are about 5589 m/s, about 4227 m/s, and about 3351 m/s, respectively. The acoustic velocities of longitudinal waves and slow transverse waves in the SiO$_2$ are about 5960 and about 3757 m/s, respectively.

As for the acoustic velocity Vm at each short-circuited boundary when the thickness of the Au electrode is 0, FIGS. 2 to 16 clearly show that the acoustic velocity of Stoneley waves primarily composed of the U3 wave component is slightly less than that of slow transverse waves propagating in the LiTaO$_3$ substrate, and that the acoustic velocity of SH boundary acoustic waves primarily composed of the U2 wave component is between the acoustic velocities of the fast transverse waves and slow transverse waves propagating in the LiTaO$_3$. The K$_2$ of Stoneley waves is as low as about 0 to about 0.2%. This means that Stoneley waves are not suitable for RF filters. On the other hand, SH boundary acoustic waves have an electromechanical coupling coefficient k$^2$ of at least about 3%, and are suitable for use as RF filters.

The longitudinal boundary waves primarily composed of the U1 wave component had such a high propagation loss α that the solution was not able to be obtained, when the Au thickness was 0. However, it was assumed from the results for the Stoneley waves and the SH boundary acoustic waves that when the Au thickness is 0, the acoustic velocity of the longitudinal boundary waves is slightly less than that of the longitudinal waves propagating in the LiTaO$_3$ substrate.

It is shown that the acoustic velocities of the Stoneley waves, the SH boundary acoustic waves, and the longitudinal boundary waves are each reduced when the thickness of the Au electrode is increased.

In addition, it is shown that when the velocity of the SH boundary acoustic waves is reduced to less than that of the slow transverse waves propagating in the SiO$_2$, the propagation loss is reduced, and that when the velocity of the SH boundary acoustic waves is further reduced to less than that of the slow transverse waves propagating in the LiTaO$_3$, the propagation loss becomes approximately 0.

As shown in FIGS. 2 to 16, the calculated values were discontinuous under the conditions that the acoustic velocity of the longitudinal waves or the transverse waves was equal to the acoustic velocity of the boundary acoustic waves. This is observed when, for example, the Vm is less than and the Vf is greater than the velocity of the slow transverse waves propagating in the SiO$_2$. In other words, this is observed when the conditions for leakage of boundary waves differ between the short-circuited boundary and the open boundary. The calculated values may also be discontinuous because of close acoustic velocities of the SH boundary waves and the Stoneley waves. In particular, calculations for the electromechanical coupling coefficient k$^2$, for which Vf and Vm are used, often result in discontinuous values.

FIGS. 17 to 48 clearly show that when the velocity of the SH boundary waves is reduced to less than that of the slow transverse waves propagating in the SiO$_2$, the propagation loss is reduced even when other metals are used for the electrode, and that when the velocity of the SH boundary waves is further reduced to less than the slow transverse waves propagating in the LiTaO$_3$, the propagation loss is approximately 0.

Figure 49:
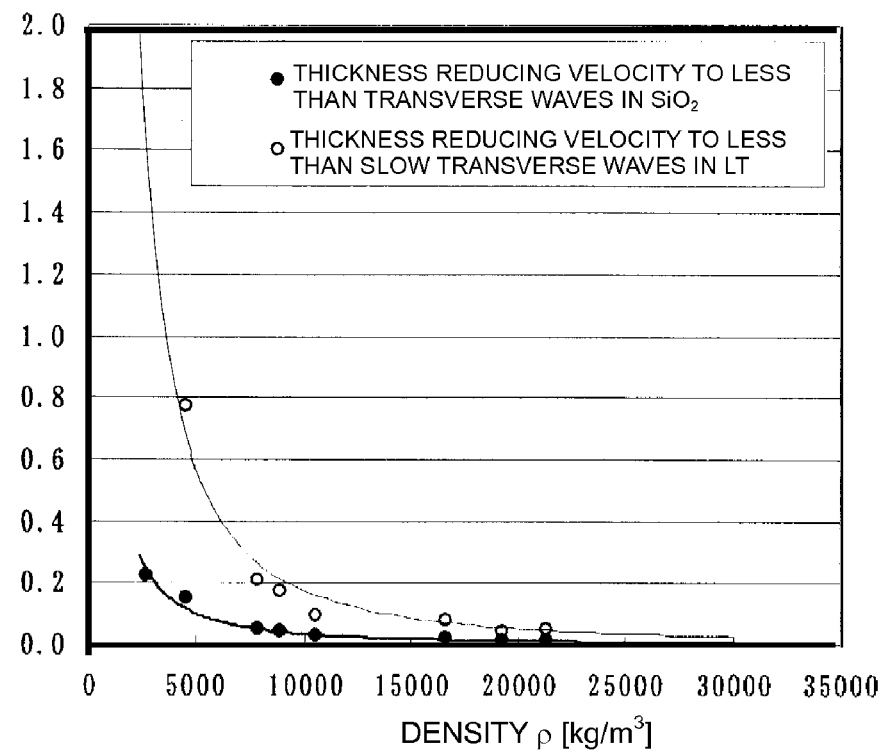
FIG. 49 is a plot showing the relationship between the density of electrode materials and the thickness at which the acoustic velocity of SH boundary waves is reduced to less than that of transverse waves.

FIG. 49 shows the relationship between the thickness H(λ) of the electrode which enables the acoustic velocity of the SH boundary waves to be reduced to less than that of the slow transverse waves propagating in the SiO$_2$ and the density ρ of the electrode material, and the relationship between the thickness H(λ) of the electrode which enables the acoustic velocity of the SH boundary waves to be reduced to less than that of the slow transverse waves propagating in the LiTaO$_3$ and the density ρ of the electrode. As clearly shown in FIG. 49, SH boundary waves with a low propagation loss are produced by satisfying the following Expression (4), and in particular, SH boundary waves with a propagation loss of approximately 0 can be produced by satisfying Expression (5).

$$H(\lambda) \rightarrow 25000 \rho^{-1.46} \quad (4)$$

$$H(\lambda) \rightarrow 1100000 \rho^{-1.7} \quad (5)$$

In the manufacture of this type of boundary acoustic wave device, an electrode, such as an IDT is provided on the LiTaO$_3$ piezoelectric substrate by photolithography, such as lift-off or dry etching, and then a dielectric layer of, for example, SiO$_2$ is formed on the electrode by a thin-layer deposition method, such as sputtering method, vapor deposition method, or CVD method. Consequently, the dielectric layer may grow at a slant angle or nonuniformly to degrade the performance of the resulting boundary acoustic wave device because of the uneven surface resulting from the thickness of the IDT. Thus, a reduced the thickness of the electrode is preferred, from the viewpoint of preventing such degradation.

A study of the present inventors has found that an electrode having a thickness H of about 0.1λ (λ: wavelength of SH boundary waves) makes it difficult to form a high-quality thin dielectric layer. In addition, an electrode having a thickness H of at least about 0.25λ in an aspect ratio of at least about 1 makes it difficult to form the electrode by inexpensive dry etching or lift-off. Furthermore, the processes and apparatuses for forming the dielectric layer by a thin-layer deposition method are limited, and RF magnetron sputtering is not suitable for the formation of the dielectric thin layer. The thickness of the electrode is preferably about 0.25λ or less, and more preferably about 0.1λ or less.

FIG. 49 suggests that by using a material with the ρ of at least about 2659 kg/m³ for the electrode, the acoustic velocity of SH boundary acoustic waves is reduced to less than that of transverse waves propagating in the $SiO_2$ and the thickness H of the electrode can be reduced to about 0.25λ or less, and the thickness values enable the decrease of propagation loss. If the material of the electrode has a ρ of at least about 4980 kg/m³, the thickness H of the electrode can be advantageously reduced to about 0.10λ or less, the thickness values enable the propagation loss to be about 0. Thus, the electrode material preferably has a density ρ of at least about 2659 kg/m³, and more preferably at least about 4980 kg/m³.

Furthermore, by using a material with a density ρ of at least about 8089 kg/m³ for the electrode, the electrode thickness H can be reduced to about 0.25λ or less, and the thickness values enable the propagation loss of the SH boundary waves to be 0. If the electrode material has a ρ of at least about 13870 kg/m³, the electrode thickness H can be reduced to about 0.10λ or less, and the thickness values enable the propagation loss to be approximately 0. Thus, the electrode material more preferably has a ρ of at least about 8089 kg/m³, and most preferably at least about 13870 kg/m³.

FIGS. 17 to 48 show that by forming the electrode to a thickness satisfying Expression (4), the electromechanical coupling coefficient $k^2$ is increased to about 3% and that the resulting boundary acoustic wave device is suitable as an RF filter.

In preferred embodiments of the present invention, the electrode may be in a form of a sheet defining a waveguide, a bus bar, and other suitable configurations, an IDT or comb-like electrode for exciting the boundary waves, or a reflector for reflecting the boundary waves.

In the Description, the Euler angles (φ, θ, ψ) representing the cutting angle of the cut surface of the substrate and the propagation direction of the boundary waves are based on the right-handed Euler angles described in a document "Acoustic Wave Device Technology Handbook" (in Japanese, Japan Society for the Promotion of Science, Acoustic Wave Device Technology the 150th Committee, 1st Edition 1st printing, published on Nov. 30, 2001, p. 549). Specifically, in LN crystallographic axes X, Y, and Z, the X axis is rotated by φ counterclockwise about the Z axis to define a Xa axis. Subsequently, the Z axis is rotated by θ counterclockwise about the Xa axis to define a Z' axis. A plane including the Xa axis and whose normal line is the Z' axis is defined as the cut surface. The propagation direction of the boundary waves is set to be the direction of the X' axis that is defined by rotating the Xa axis by ψ counterclockwise about the Z' axis.

As for the $LiTaO_3$ crystallographic axes X, Y, and Z defining the initial Euler angles, the Z axis is set to be parallel to the C axis, the X axis is set to be parallel to one of the equivalent a axes extending in three directions, and the Y axis is set to be the normal line of a plane including the X axis and the Z axis.

Crystallographically equivalent Euler angles suffice for the $LiTaO_3$ Euler angles (φ, θ, ψ) in preferred embodiments of the present invention. For example, Document 7 (Journal of the Acoustical Society of Japan (in Japanese) Vol. 36, No. 3, 1980, pp. 140 to 145) has taught that $LiTaO_3$ belongs to the trigonal 3m point group, and Equation (A) therefore is satisfied.

$$F(\phi, \theta, \psi) = F(60° - \phi, -\theta, \psi) \quad \text{Equation (A)}$$
$$= F(60° + \phi, -\theta, 180° - \psi)$$
$$= F(\phi, 180° + \theta, 180° - \psi)$$
$$= F(\phi, \theta, 180° + \psi)$$

where F represents any boundary wave property, such as electromechanical coupling coefficient $k^2$, propagation loss, TCF, PFA, or a natural unidirectional property. For example, when the propagation direction is reversed, the PFA and the natural unidirectional property are changed in plus/minus sign, but their absolute values do not change; hence they are estimated to be practically equivalent. Although Document 7 discusses surface waves, the same applies to the boundary waves in terms of crystalline symmetry. For example, the propagation characteristics of boundary waves with Euler angles of (30°, θ, ψ) are equivalent to those of boundary waves with Euler angles of (90°, 180°-θ, 180°-ψ). For example, the propagation characteristics of boundary waves with Euler angles (30°, 90°, 45°) are equivalent to those of boundary waves with Euler angles shown in Table 1.

Although the material constants of the electrode used for the calculations in preferred embodiments of the present invention are those of the electrode in polycrystal, an electrode of a crystal such as an epitaxial film can also provide similar boundary wave propagation characteristics that cause no problem even if the Euler angles are equivalent as expressed by Equation (A). This is because the crystal orientation dependence of the substrate is more dominant for the boundary wave characteristics than for the film itself.

TABLE 1

| φ (°) | θ (°) | ψ (°) |
|---|---|---|
| 30 | 90 | 225 |
| 30 | 270 | 135 |
| 30 | 270 | 315 |
| 90 | 90 | 135 |
| 90 | 90 | 315 |
| 90 | 270 | 45 |
| 90 | 270 | 225 |
| 150 | 90 | 45 |
| 150 | 90 | 225 |
| 150 | 270 | 135 |
| 150 | 270 | 315 |
| 210 | 90 | 135 |
| 210 | 90 | 315 |
| 210 | 270 | 45 |
| 210 | 270 | 225 |
| 270 | 90 | 45 |
| 270 | 90 | 225 |
| 270 | 270 | 135 |
| 270 | 270 | 315 |

TABLE 1-continued

| φ (°) | θ (°) | ψ (°) |
|---|---|---|
| 330 | 90 | 135 |
| 330 | 90 | 315 |
| 330 | 270 | 45 |
| 330 | 270 | 225 |

In preferred embodiments of the present invention, the material of the electrode can be selected not only from the group consisting of Al, Ti, Fe, Cu, Ag, Ta, Au, and Pt, but also from other electroconductive materials. The electrode may include a second electrode layer formed of Ti, Cr, NiCr, or other suitable material on the upper or lower surface of the main electrode layer in order to enhance the adhesion or the electric power resistance. In other words, the electrode may have a multilayer structure.

The dielectric layer include not only $SiO_2$, but also Si, glass, SiN, SiC, ZnO, $Ta_2O_5$, lead zirconate titanate ceramics, AlN, $Al_2O_3$, $LiTaO_3$, $LiNbO_3$, An, and so forth. In other words, the dielectric layer may include a piezoelectric material. The dielectric layer may have a multilayer structure including a plurality of dielectric layers.

The boundary acoustic wave device according to preferred embodiments of the present invention may further include a protective layer outside the structure having the electrode between the $LiTaO_3$ and the dielectric layer. More specifically, the protective layer may be provided on the surface of the dielectric layer opposite the boundary, or the surface of the piezoelectric body opposite the boundary. The protective layer enhances the strength of the boundary acoustic wave device, or prevent corrosive gases from infiltrating into the device. The protective layer may include an appropriate material, such as an insulating ceramic, a synthetic resin, or a metal. Synthetic resin protective layers enhance the resistance to infiltration of corrosive gases and moisture. Insulating ceramic protective layers enhance the mechanical strength and prevent the infiltration of corrosive gases. Such insulating ceramics include titanium oxide, aluminium nitride, and aluminium oxide. Metal protective layers can enhance the mechanical strength and provide an electromagnetic shielding function. Such metals include Au, Al, and W.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device comprising:
a $LiTaO_3$ piezoelectric body;
a dielectric body disposed on one surface of the piezoelectric body; and
an electrode disposed at a boundary between the piezoelectric body and the dielectric body; wherein
the electrode satisfies the expression
$H(\lambda)$>about $1.1 \times 10^6 \rho^{-1.7}$, where the electrode has a density of $\rho$ (kg/m$^3$) and a thickness of $H(\lambda)$ and boundary acoustic waves have a wavelength of $\lambda$.

2. The boundary acoustic wave device according to claim 1, wherein the expression $\rho$>about 4980 kg/m$^3$ is satisfied.

3. The boundary acoustic wave device according to claim 1, wherein the electrode primarily comprises an electrode layer made of at least one metal selected from the group consisting of Al, Ti, Fe, Cu, Ag, Ta, Au, and Pt.

4. The boundary acoustic wave device according to claim 3, wherein the electrode further comprises a second electrode layer provided on one of an upper and a lower surface of the electrode layer and made of a different electrode material from the electrode layer.

5. The boundary acoustic wave device according to claim 1, wherein the dielectric body is made of a non-piezoelectric material.

6. The boundary acoustic wave device according to claim 1, wherein the dielectric body has a multilayer structure including a plurality of dielectric layers.

7. The boundary acoustic wave device according to claim 1, wherein the dielectric layer is made of at least one selected from the group consisting of Si, $SiO_2$, glass, SiN, SiC, ZnO, $Ta_2O_5$, lead zirconate titanate ceramics, AlN, $Al_2O_3$, $LiTaO_3$, $LiNbO_3$, and potassium niobate.

8. The boundary acoustic wave device according to claim 1, wherein the dielectric layer is formed by deposition method.

9. The boundary acoustic wave device according to claim 1, further comprising a resin layer disposed on a surface of the dielectric layer opposite the boundary.

10. A boundary acoustic wave device comprising:
a $LiTaO_3$ piezoelectric body;
a $SiO_2$ dielectric body disposed on one surface of the piezoelectric body; and
an electrode disposed at a boundary between the piezoelectric body and the dielectric body; wherein
the electrode satisfies the expression $H(\lambda)$>about $25000\rho^{-1.46}$, where the electrode has a density of $\rho$ (kg/m$^3$) and a thickness of $H(\lambda)$ and boundary acoustic waves have a wavelength of $\lambda$.

11. The boundary acoustic wave device according to claim 10, wherein the expression $\rho$>about 2659 kg/m$^3$ is satisfied.

12. The boundary acoustic wave device according to claim 10, wherein the expression $\rho$>about 4980 kg/m$^3$ is satisfied.

13. The boundary acoustic wave device according to claim 10, wherein the electrode primarily comprises an electrode layer made of at least one metal selected from the group consisting of Al, Ti, Fe, Cu, Ag, Ta, Au, and Pt.

14. The boundary acoustic wave device according to claim 13, wherein the electrode further comprises a second electrode layer provided on one of an upper and a lower surface of the electrode layer and made of a different electrode material from the electrode layer.

15. The boundary acoustic wave device according to claim 12, wherein the dielectric body is made of a non-piezoelectric material.

16. The boundary acoustic wave device according to claim 10, wherein the dielectric body has a multilayer structure including a plurality of dielectric layers.

17. The boundary acoustic wave device according to claim 12, wherein the dielectric layer is made of at least one selected from the group consisting of Si, $SiO_2$, glass, SiN, SiC, ZnO, $Ta_2O_5$, lead zirconate titanate ceramics, AlN, $Al_2O_3$, $LiTaO_3$, $LiNbO_3$, and potassium niobate.

18. The boundary acoustic wave device according to claim 10, wherein the dielectric layer is formed by deposition method.

19. The boundary acoustic wave device according to claim 10, further comprising a resin layer formed on a surface of the dielectric layer opposite the boundary.

* * * * *